(12) United States Patent
Tanaka

(10) Patent No.: US 11,656,243 B2
(45) Date of Patent: May 23, 2023

(54) PHYSICAL QUANTITY SENSOR, ELECTRONIC APPARATUS, AND VEHICLE

(71) Applicant: Seiko Epson Corporation, Toyko (JP)

(72) Inventor: Satoru Tanaka, Chino (JP)

(73) Assignee: SEIKO EPSON CORPORATION

( * ) Notice: Subject to any disclaimer, the term of this patent is extended or adjusted under 35 U.S.C. 154(b) by 125 days.

(21) Appl. No.: 17/186,114

(22) Filed: Feb. 26, 2021

(65) Prior Publication Data

US 2021/0285983 A1    Sep. 16, 2021

(30) Foreign Application Priority Data

Feb. 28, 2020   (JP) .............................. JP2020-034032
Aug. 11, 2020   (JP) .............................. JP2020-135829

(51) Int. Cl.
*G01P 15/18*   (2013.01)
*G01P 15/125*  (2006.01)
*G01P 15/08*   (2006.01)
*B81B 3/00*    (2006.01)

(52) U.S. Cl.
CPC ............ *G01P 15/18* (2013.01); *B81B 3/0008* (2013.01); *B81B 2203/058* (2013.01); *G01P 15/125* (2013.01); *G01P 2015/0831* (2013.01); *G01P 2015/0871* (2013.01); *G01P 2015/0882* (2013.01)

(58) Field of Classification Search
CPC ........ G01P 15/18; G01P 15/00; G01P 15/125; G01P 2015/0882; G01P 2015/0831; G01P 2015/0871; B81B 2201/0235; B81B 2203/058; B81B 3/0008
See application file for complete search history.

(56) References Cited

U.S. PATENT DOCUMENTS

| | | | |
|---|---|---|---|
| 2009/0090987 A1* | 4/2009 | Yoshikawa | G11B 19/042 257/415 |
| 2018/0275162 A1* | 9/2018 | Tanaka | G01C 21/10 |
| 2019/0064201 A1 | 2/2019 | Tanaka | |
| 2019/0302142 A1* | 10/2019 | Tanaka | G01C 19/5783 |

FOREIGN PATENT DOCUMENTS

JP    2019-045167 A    3/2019

* cited by examiner

*Primary Examiner* — Manuel L Barbee
(74) *Attorney, Agent, or Firm* — Harness, Dickey & Pierce, P.L.C.

(57) ABSTRACT

A physical quantity sensor includes, when three directions orthogonal to one another are defined as a first direction, a second direction, and a third direction, a substrate; and a moving member facing the substrate in the third direction via a gap and becoming displaced in the third direction in relation to the substrate. The moving member has a first region that has a plurality of penetration holes penetrating the moving member in the third direction and having a square opening shape as viewed from the third direction, and a second region having no penetration hole. At least one of a length in the first direction and a length in the second direction of the second region is equal to or greater than $S0+2\times S1$, where $S0$ is a length of one side of the penetration hole, and $S1$ is a space between the penetration holes next to each other.

11 Claims, 32 Drawing Sheets

PHYSICAL QUANTITY SENSOR, ELECTRONIC APPARATUS, AND VEHICLE

The present application is based on, and claims priority from JP Application Serial Number 2020-034032, filed Feb. 28, 2020, and JP Application Serial Number 2020-135829, filed Aug. 11, 2020, the disclosures of which are hereby incorporated by reference herein in their entirety.

BACKGROUND

1. Technical Field

The present disclosure relates to a physical quantity sensor, an electronic apparatus, and a vehicle.

2. Related Art

For example, an acceleration sensor described in JP-A-2019-045167 has a substrate, a fixed part fixed to the substrate, a moving member coupled to the fixed part via a beam, and a fixed detection electrode arranged at the substrate and detecting an electrostatic capacitance generated between the moving member and the fixed detection electrode. When an acceleration is applied from a direction in which the moving member and the fixed detection electrode overlap each other, the moving member swings about the beam as a rotation axis. With this swing, the space between the moving member and the fixed detection electrode changes and therefore the electrostatic capacitance changes. Thus, the acceleration sensor described in JP-A-2019-045167 can detect an acceleration, based on a change in the electrostatic capacitance.

Also, the acceleration sensor described in JP-A-2019-045167 has a protrusion protruding from the substrate. When an excessive acceleration is applied, the moving member comes into contact with this protrusion. This restrains the moving member from colliding with or sticking to the substrate. Although a penetration hole for reducing a damping is formed in the moving member, the penetration hole is not formed at the part that comes into contact with the protrusion. This secures the mechanical strength of this part and restrains the moving member from being damaged by the impact of coming into contact with the protrusion.

However, such a configuration is not enough to sufficiently increase the mechanical strength of the moving member.

SUMMARY

A physical quantity sensor according to an aspect of the present disclosure includes, when three directions orthogonal to one another are defined as a first direction, a second direction, and a third direction, a substrate; and a moving member facing the substrate in the third direction via a gap and becoming displaced in the third direction in relation to the substrate. The moving member has a first region that has a plurality of penetration holes penetrating the moving member in the third direction and having a square opening shape as viewed from the third direction, and a second region having no penetration hole. At least one of a length in the first direction and a length in the second direction of the second region is equal to or greater than S0+2×S1, where S0 is a length of one side of the penetration hole, and S1 is a space between the penetration holes next to each other.

A physical quantity sensor according to another aspect of the present disclosure includes, when three directions orthogonal to one another are defined as a first direction, a second direction, and a third direction, a substrate; and a moving member facing the substrate in the third direction via a gap and becoming displaced in the third direction in relation to the substrate. The moving member has a first region that has a plurality of penetration holes penetrating the moving member in the third direction and having a circular opening shape as viewed from the third direction, and a second region having no penetration hole. At least one of a length in the first direction and a length in the second direction of the second region is equal to or greater than $4 \times r_c - 2 \times r_0$, where $r_0$ is a radius of the penetration hole, and $r_c$ is half a distance between centers of the penetration holes next to each other.

A physical quantity sensor according to still another aspect of the present disclosure includes, when three directions orthogonal to one another are defined as a first direction, a second direction, and a third direction, a substrate; and a moving member facing the substrate in the third direction via a gap and becoming displaced in the third direction in relation to the substrate. The moving member has a first region that has a plurality of penetration holes penetrating the moving member in the third direction and having a polygonal opening shape as viewed from the third direction, and a second region having no penetration hole. At least one of a length in the first direction and a length in the second direction of the second region is equal to or greater than S0+2×S1, where S0 is a square root of area of the penetration hole, and S1 is a value of spaces between the penetration holes next to each other in the first direction and the second direction added together and divided by 2.

DESCRIPTION OF EXEMPLARY EMBODIMENTS

A physical quantity sensor, an electronic apparatus, and a vehicle according to the present disclosure will now be described in detail, based on embodiments shown in the accompanying drawings.

First Embodiment

First, a physical quantity sensor according to a first embodiment of the present disclosure will be described.

Figure 1:
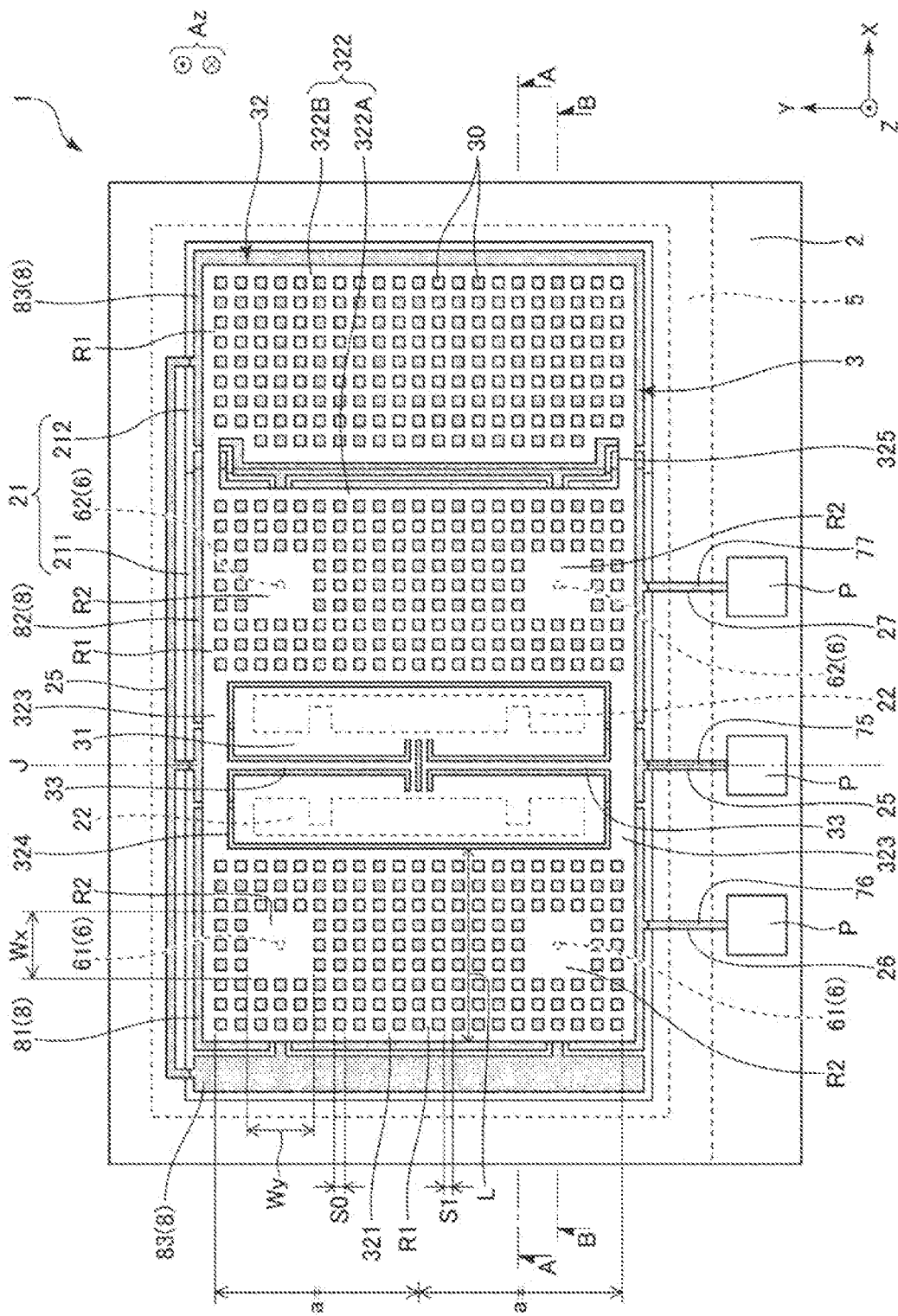
FIG. 1 is a plan view showing a physical quantity sensor according to a first embodiment of the present disclosure.
Figure 2:
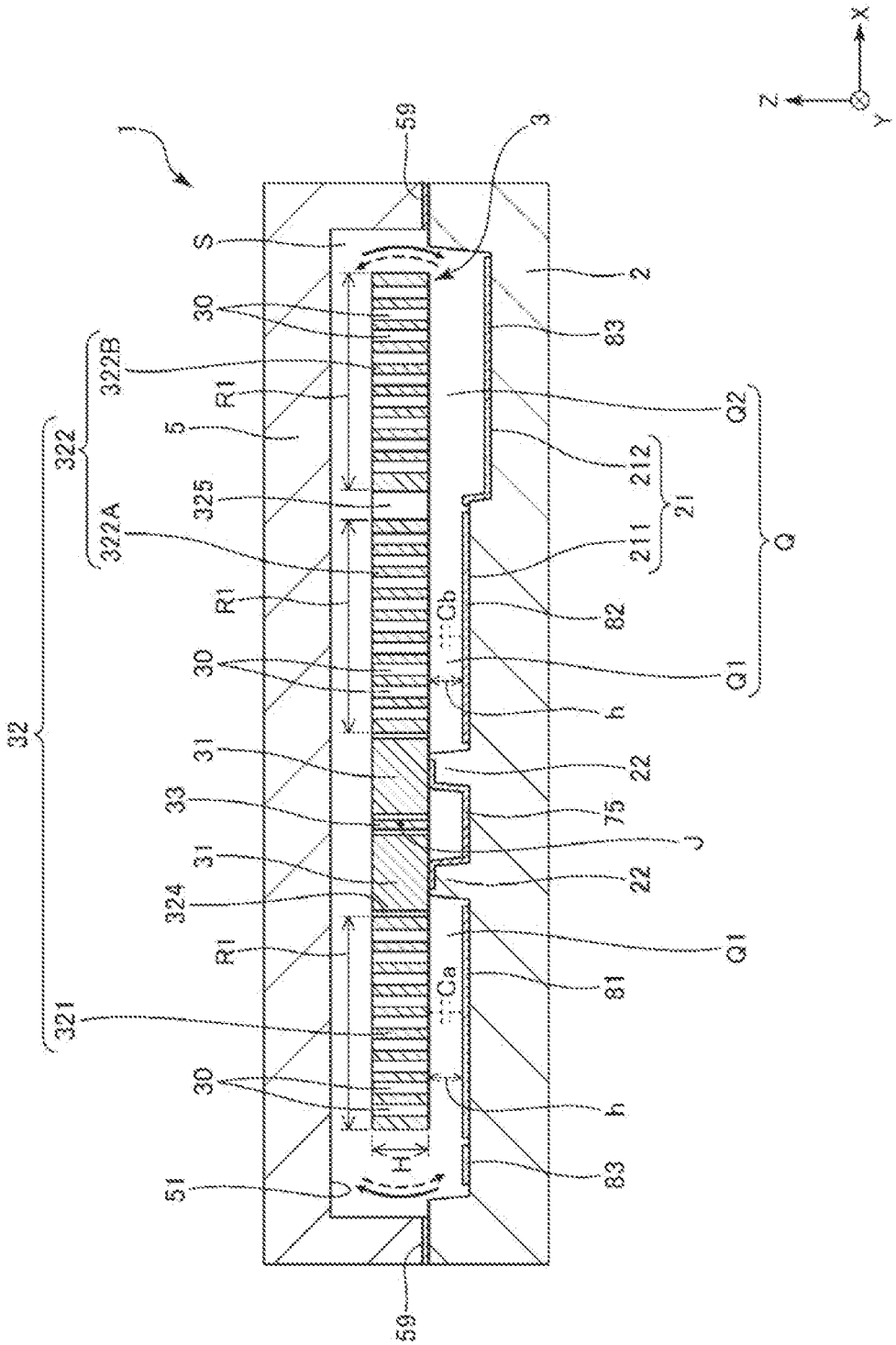
FIG. 2 is a cross-sectional view taken along A-A in FIG. 1.
Figure 3:
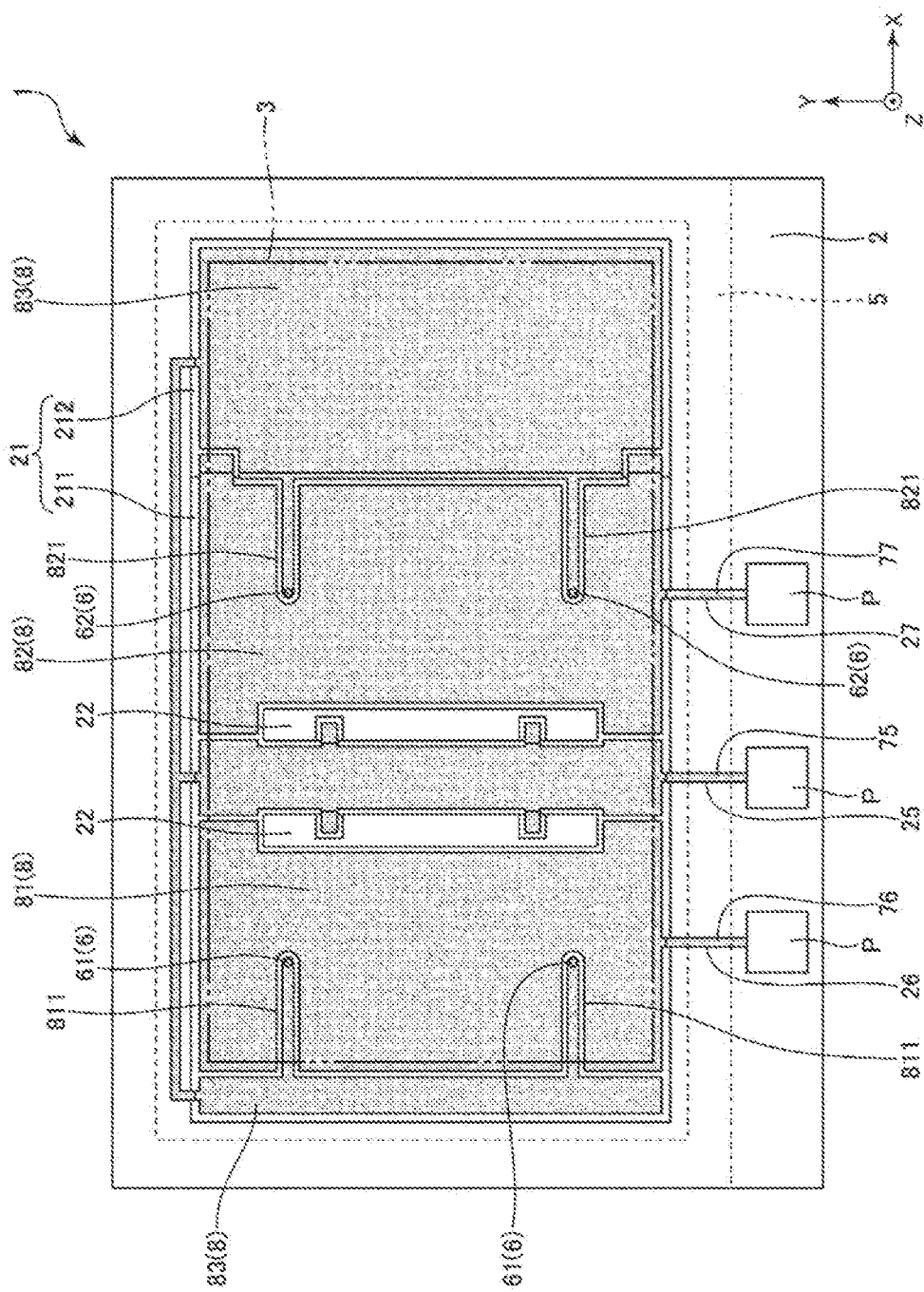
FIG. 3 is a plan view showing an electrode provided in the physical quantity sensor shown in FIG. 1.
Figure 4:
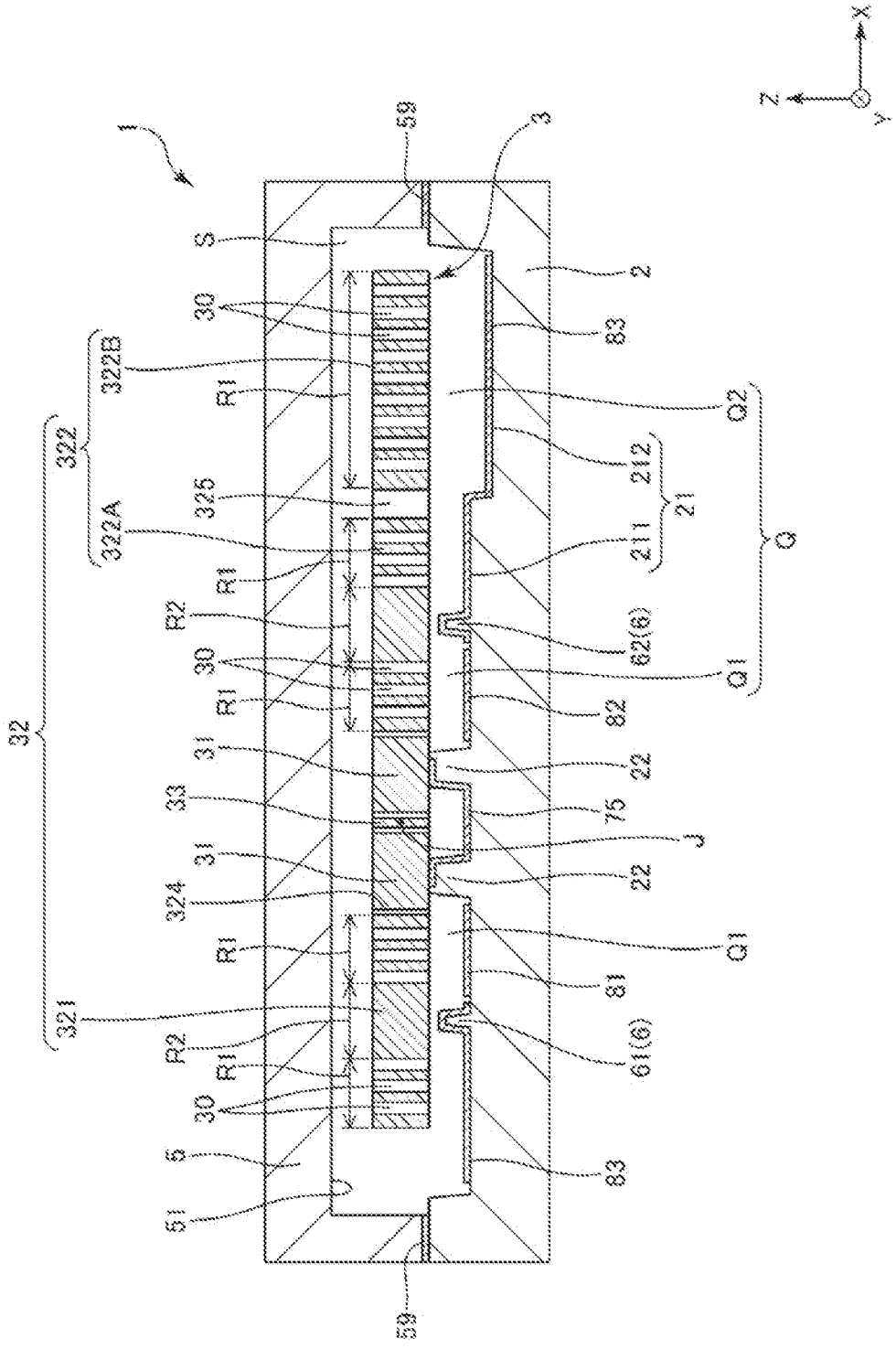
FIG. 4 is a cross-sectional view taken along B-B in FIG. 1.
Figure 5:
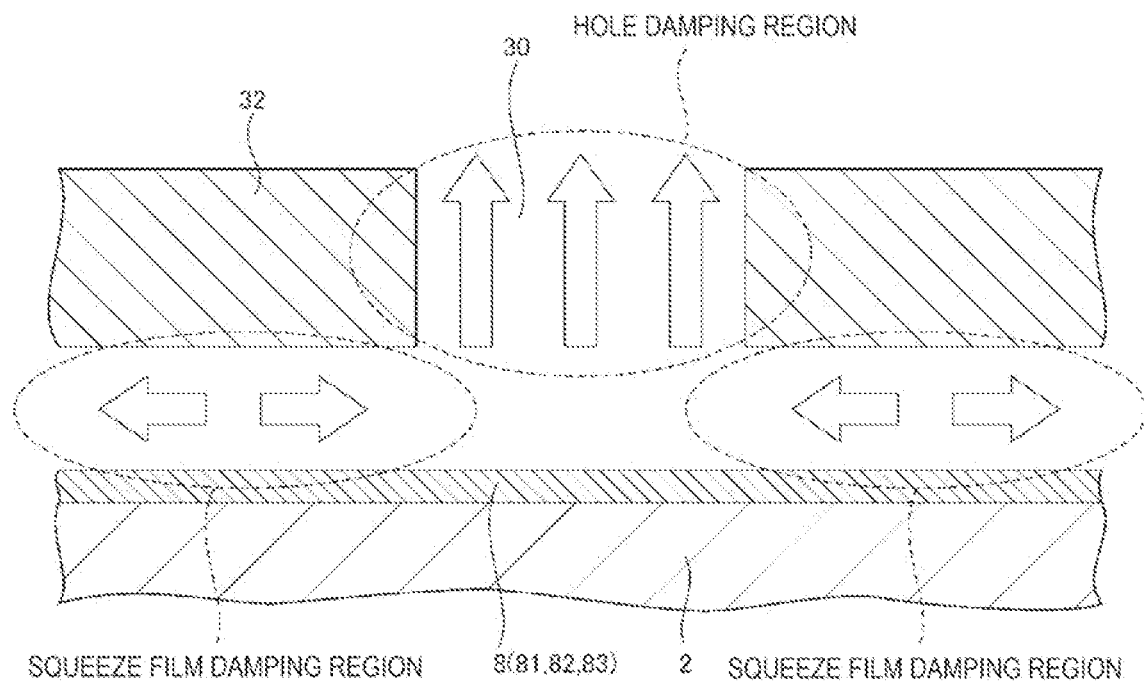
FIG. 5 is a schematic view for explaining damping.
Figure 6:
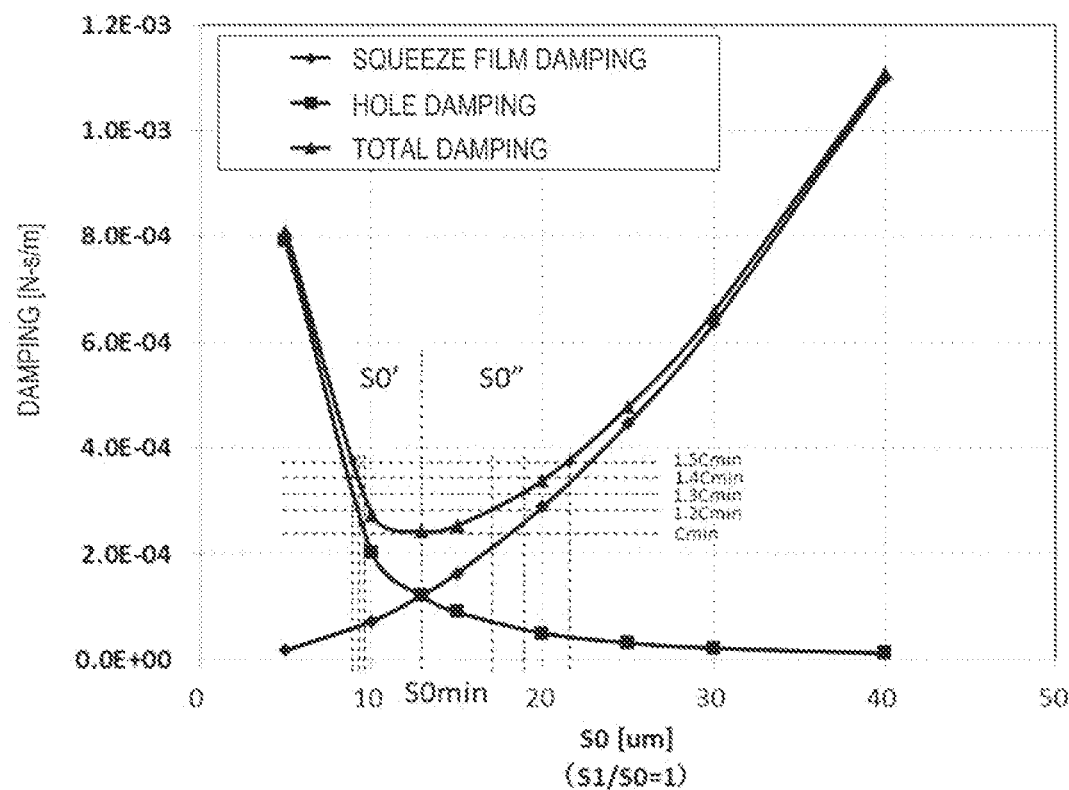
FIG. 6 is a graph showing the relationship between S0 and damping.
Figure 7:
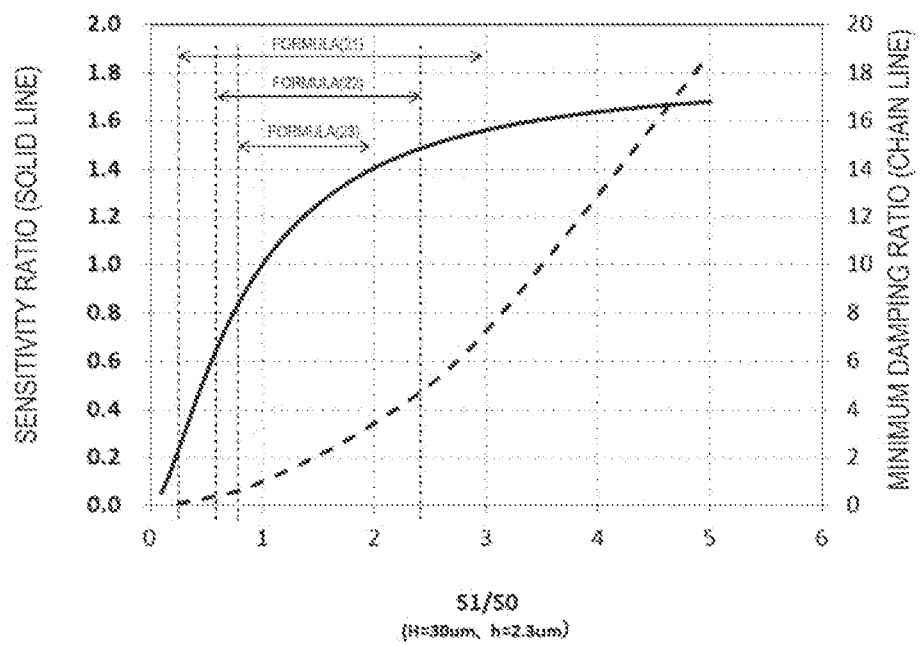
FIG. 7 is a graph showing the relationship between S1/S0, and sensitivity ratio and damping ratio.
Figure 8:
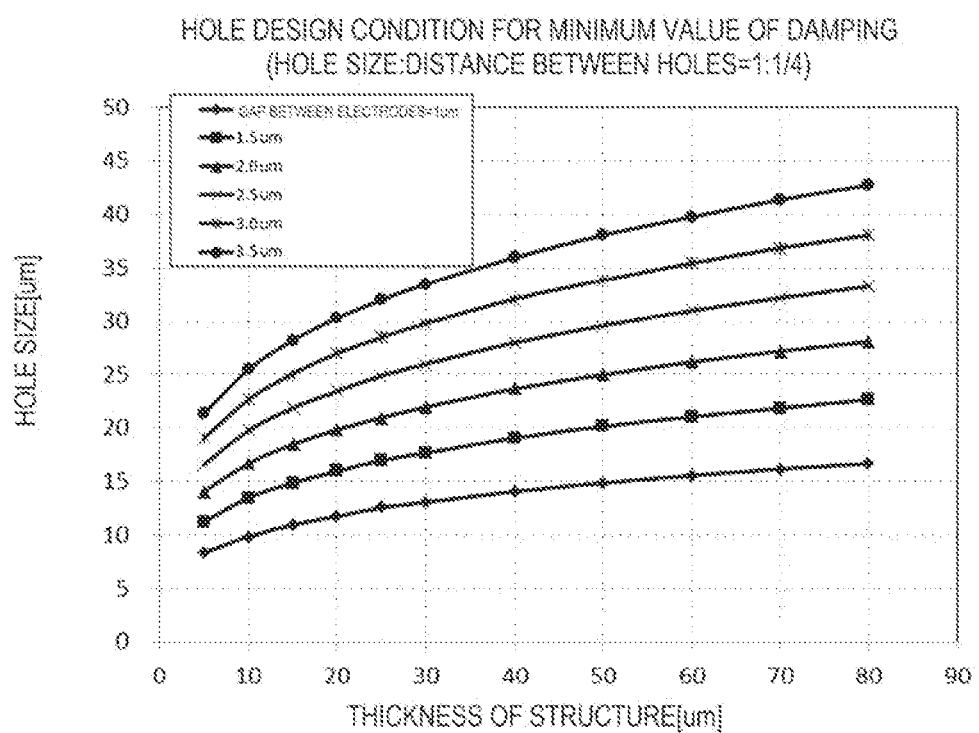
FIG. 8 is a graph showing the relationship between structure thickness and hole size.
Figure 9:
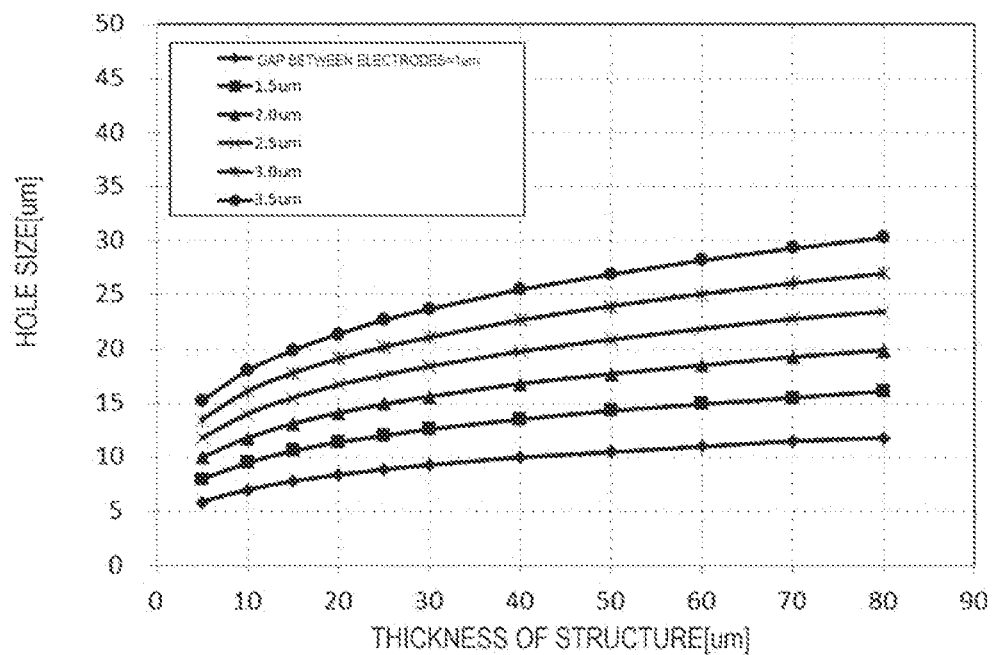
FIG. 9 is a graph showing the relationship between structure thickness and hole size.
Figure 10:
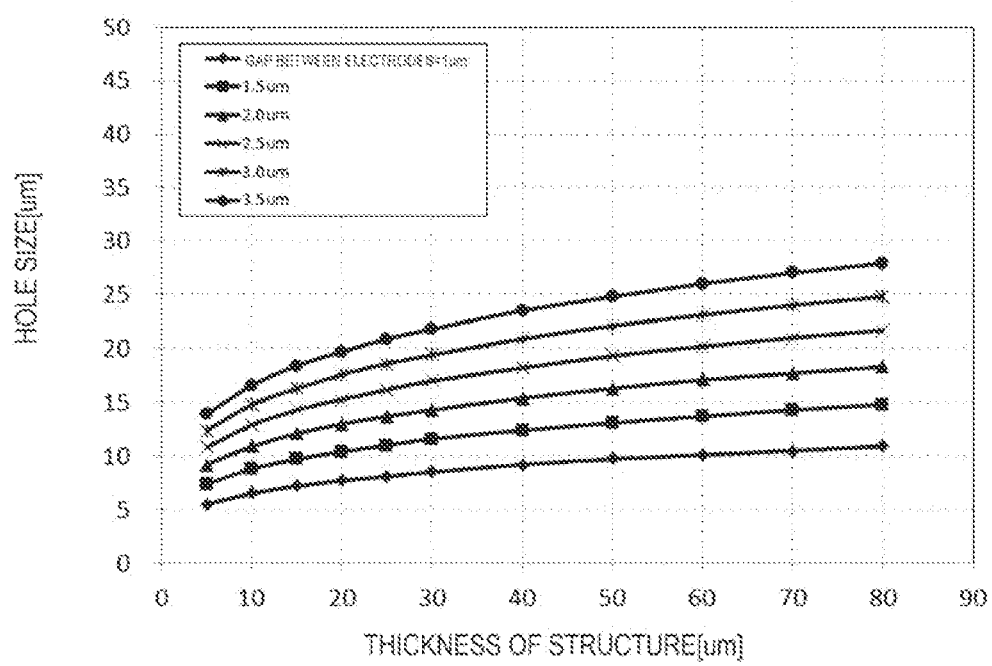
FIG. 10 is a graph showing the relationship between structure thickness and hole size.
Figure 11:
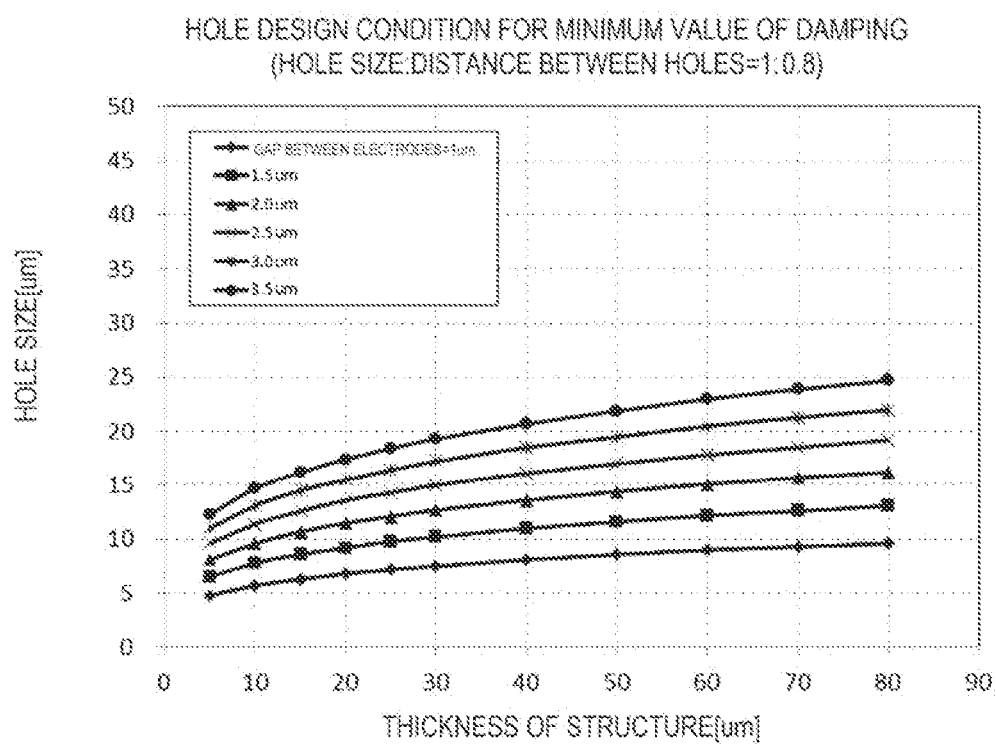
FIG. 11 is a graph showing the relationship between structure thickness and hole size.
Figure 12:
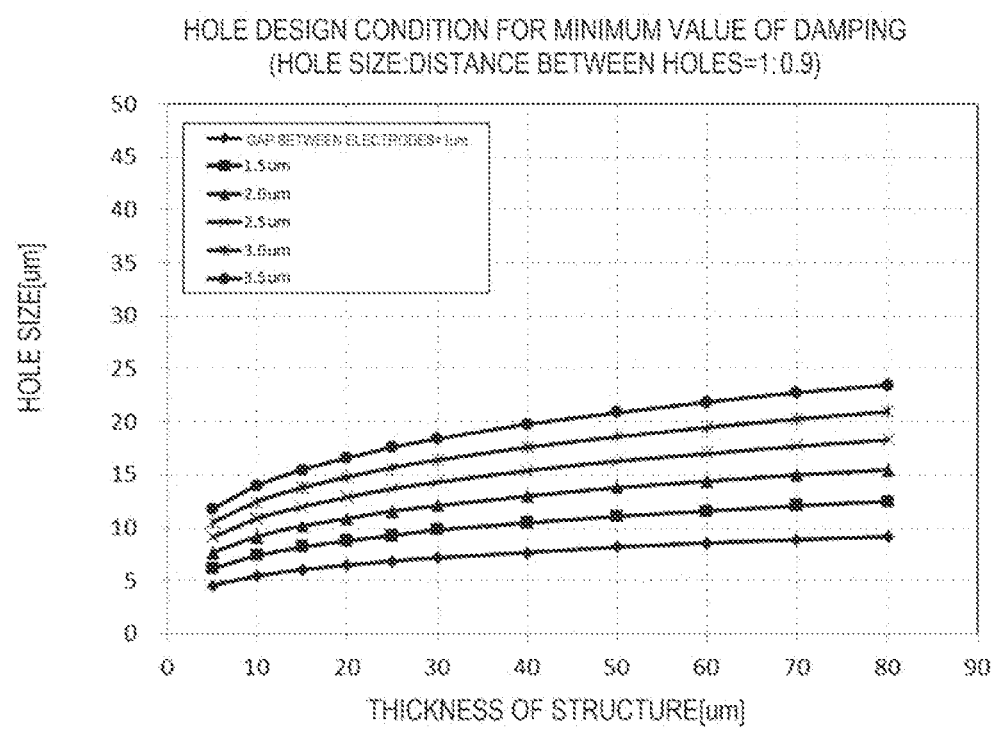
FIG. 12 is a graph showing the relationship between structure thickness and hole size.
Figure 13:
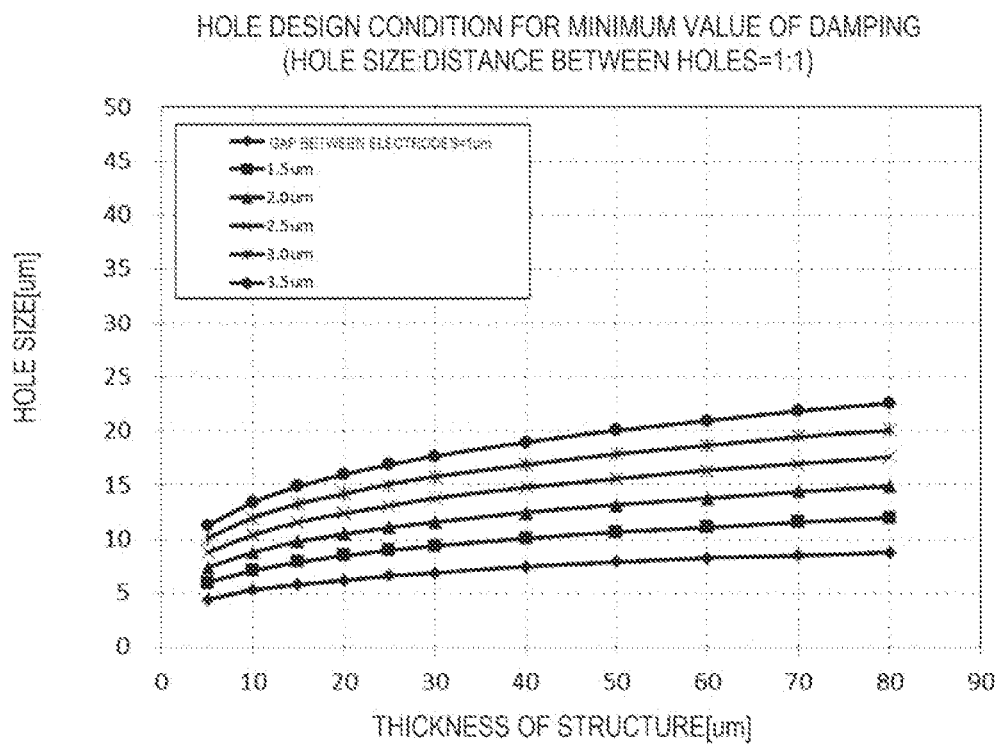
FIG. 13 is a graph showing the relationship between structure thickness and hole size.
Figure 14:
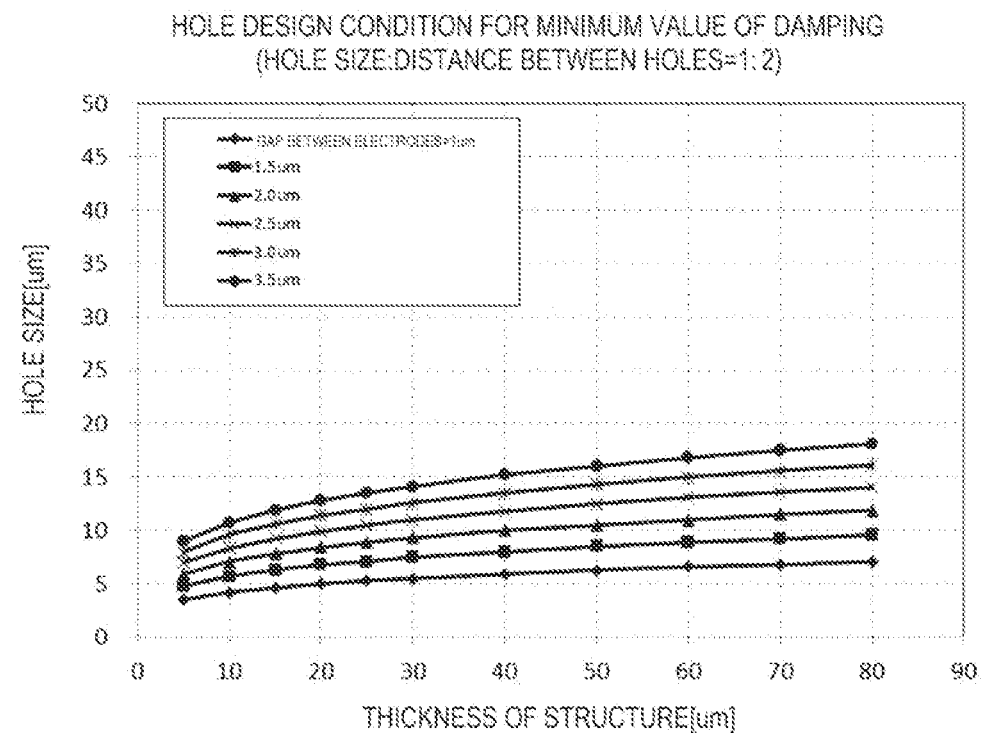
FIG. 14 is a graph showing the relationship between structure thickness and hole size.
Figure 15:
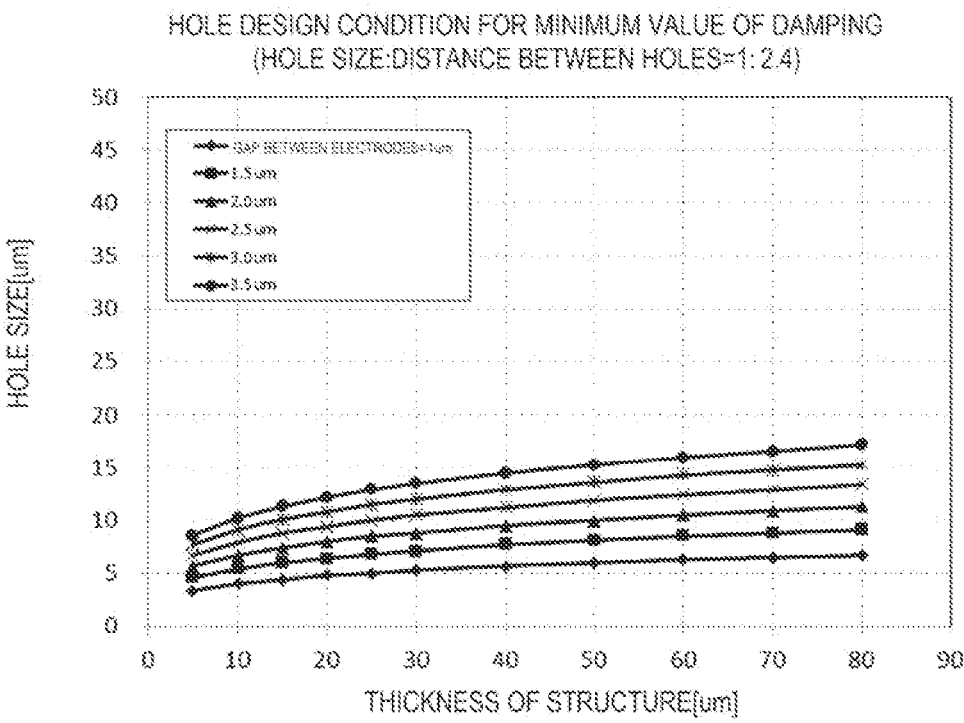
FIG. 15 is a graph showing the relationship between structure thickness and hole size.
Figure 16:
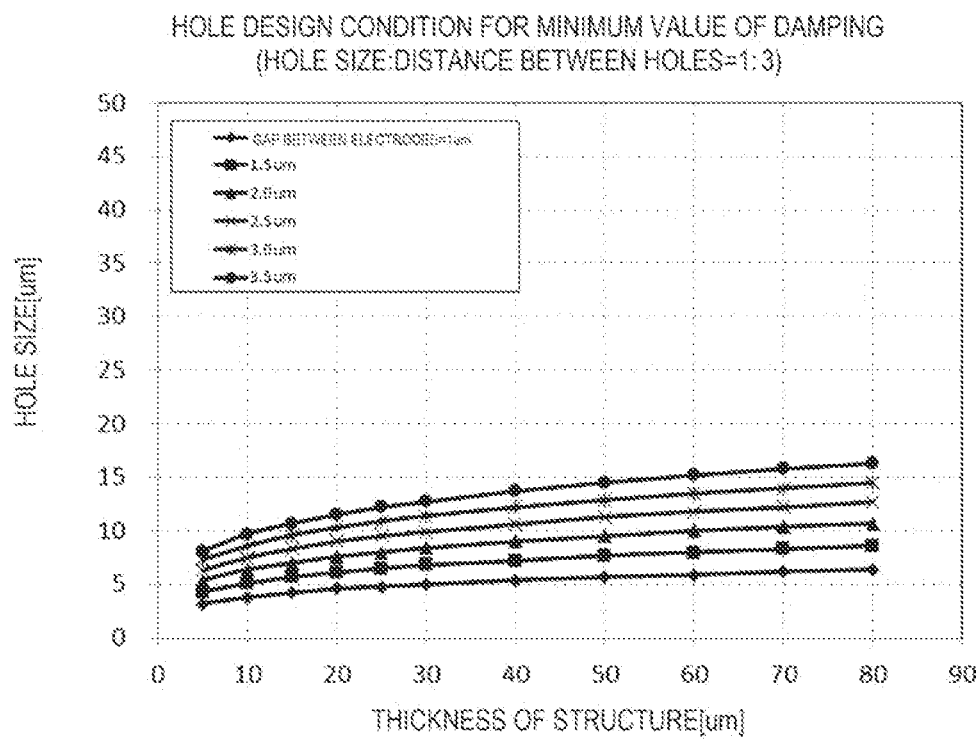
FIG. 16 is a graph showing the relationship between structure thickness and hole size.
Figure 24:
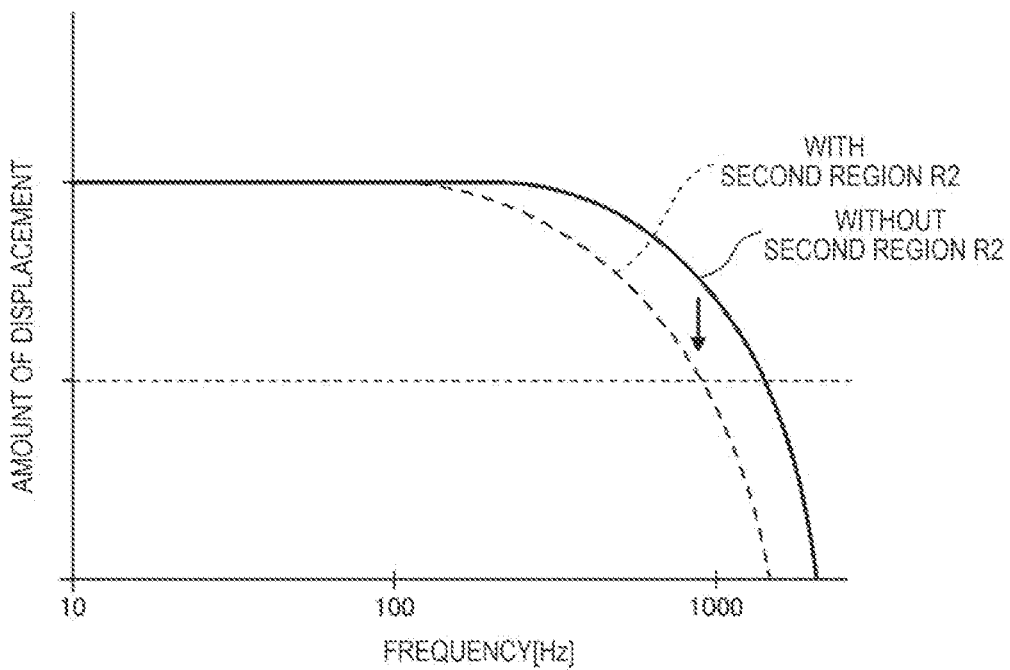
FIG. 24 is a graph showing the relationship between frequency of vibration applied and amount of displacement.
Figure 25:
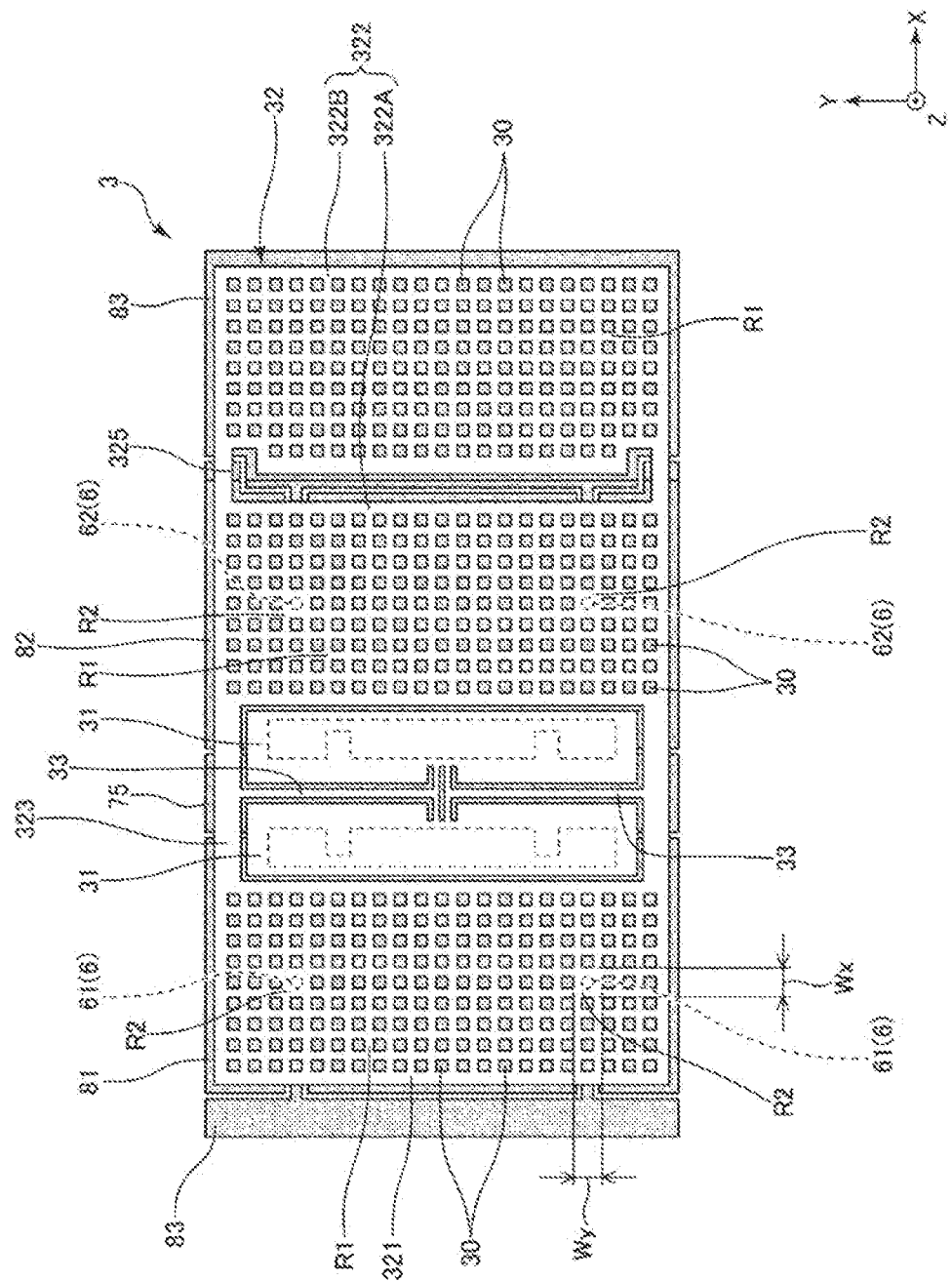
FIG. 25 is a plan view showing a modification example of the physical quantity sensor shown in FIG. 1.
Figure 26:
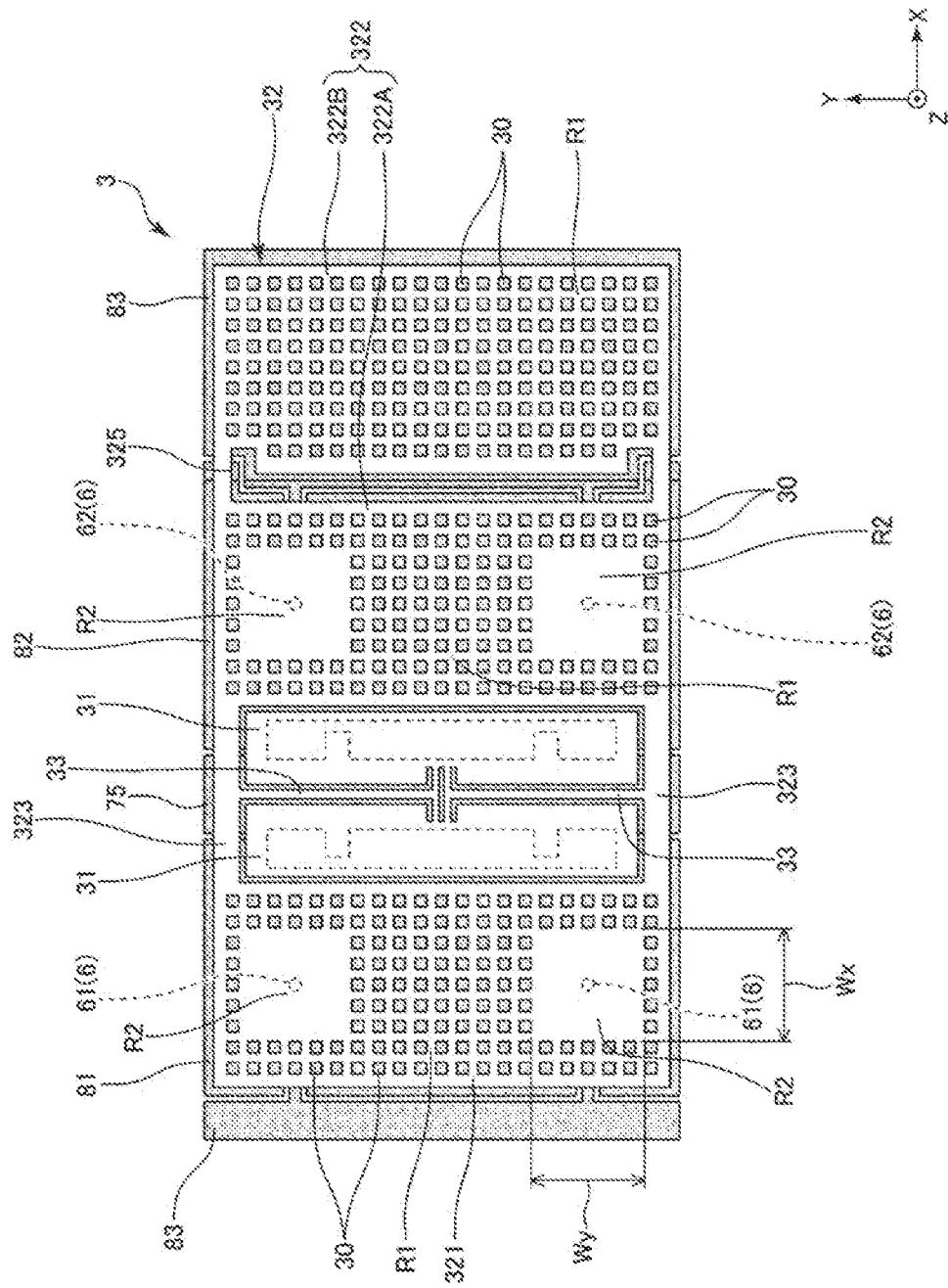
FIG. 26 is a plan view showing a modification example of the physical quantity sensor shown in FIG. 1.
Figure 27:
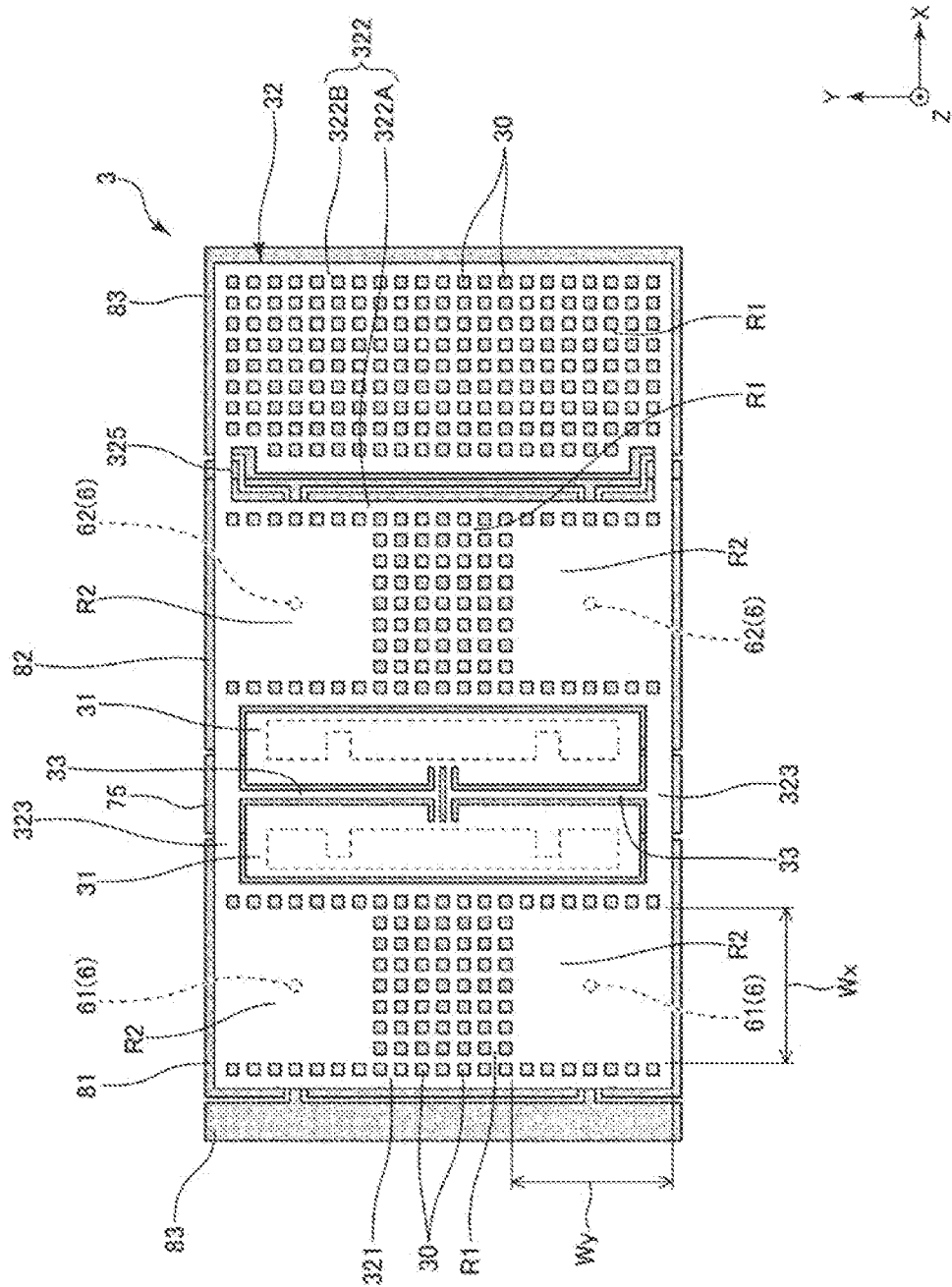
FIG. 27 is a plan view showing a modification example of the physical quantity sensor shown in FIG. 1.
Figure 28:
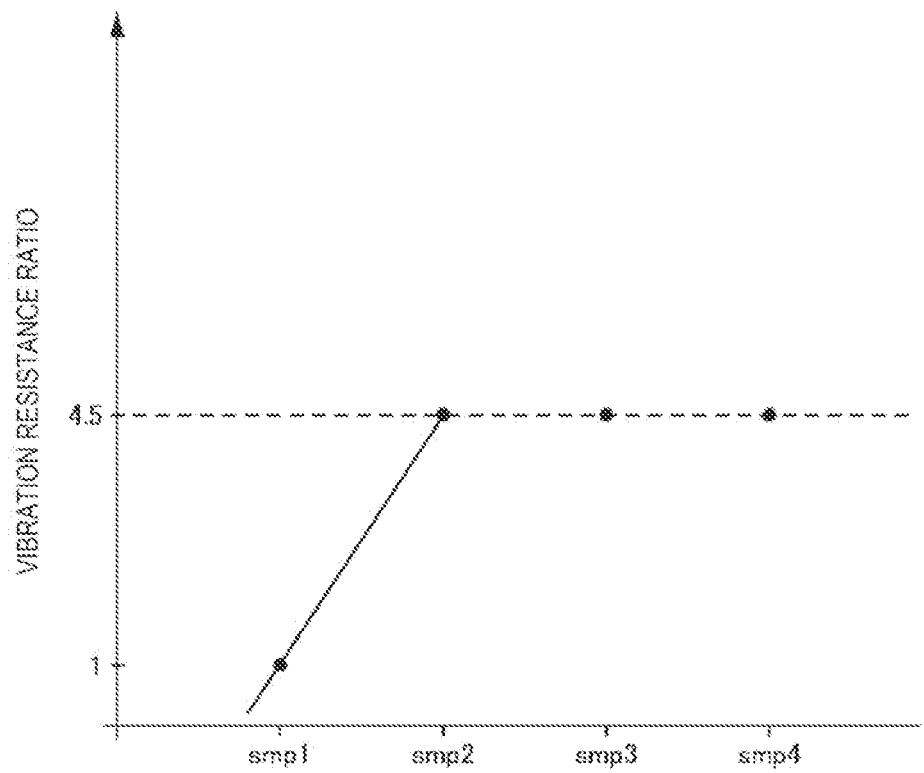
FIG. 28 is a graph showing the result of random testing of vibration resistance.
Figure 29:
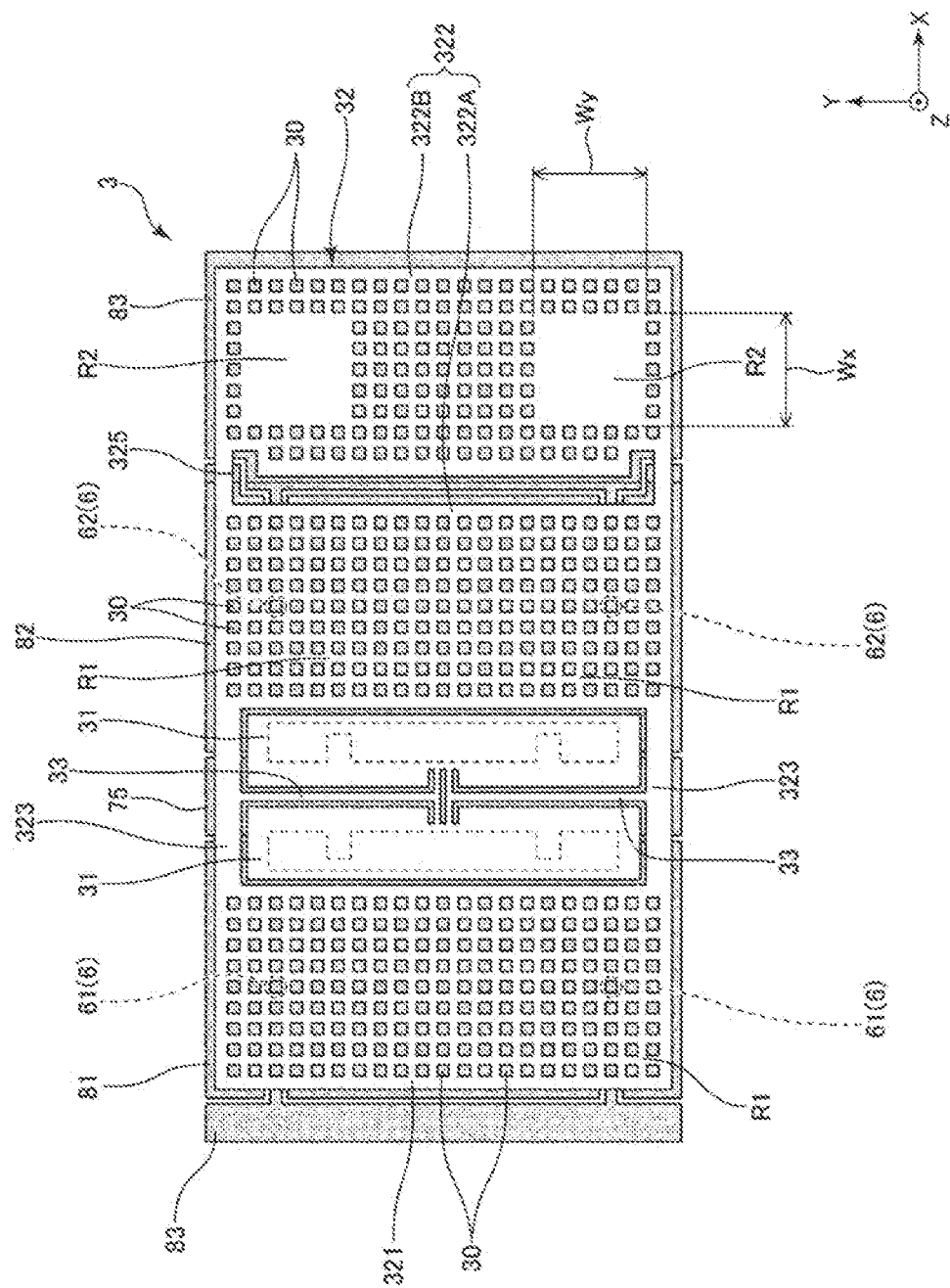
FIG. 29 is a plan view showing a modification example of the physical quantity sensor shown in FIG. 1.

FIG. 1 is a plan view showing the physical quantity sensor according to the first embodiment of the present disclosure. FIG. 2 is a cross-sectional view taken along A-A in FIG. 1. FIG. 3 is a plan view showing an electrode provided in the physical quantity sensor shown in FIG. 1. FIG. 4 is a cross-sectional view taken along B-B in FIG. 1. FIG. 5 is a schematic view for explaining damping. FIG. 6 is a graph showing the relationship between S0 and damping. FIG. 7 is a graph showing the relationship between S1/S0, and sensitivity ratio and damping ratio. FIGS. 8 to 16 are graphs showing the relationship between structure thickness and hole size. FIGS. 17 to 23 are graphs showing the relationship between S0min, S1min and H, h. FIG. 24 is a graph showing the relationship between frequency of vibration applied and the amount of displacement of the moving member. FIGS. 25 to 27 are plan views showing a modification example of the physical quantity sensor shown in FIG. 1. FIG. 28 is a graph showing the result of random testing of vibration resistance. FIGS. 29 to 36 are plan views showing a modification example of the physical quantity sensor shown in FIG. 1.

In the description below, for the sake of convenience of the description, an X-axis, a Y-axis, and a Z-axis are employed as three axes orthogonal to one another. A direction parallel to the X-axis is referred to as an X-axis direction, which is a second direction. A direction parallel to the Y-axis is referred to as a Y-axis direction, which is a first direction. A direction parallel to the Z-axis is referred to as a Z-axis direction, which is a third direction. The tip side of the arrow on each axis is referred to as a "positive side". The opposite side is referred to as a "negative side". The positive side of the Z-axis direction is referred to as "up". The negative side of the Z-axis direction is referred to as "down". Also, a plan view from the Z-axis direction is simply referred to as a "plan view". In FIGS. 25 to 36, for the sake of convenience of the description, the illustration of a substrate 2 and a lid 5 is omitted.

In this specification, the meaning of the term "orthogonal" includes the state of intersecting at 90° and also the state of intersecting at an angle slightly deviated from 90°, for example, at approximately 80° to 100°. Specifically, the meaning of the term "orthogonal" includes the case where the X-axis is inclined at approximately −10° to +10° to the direction of a normal line to a YZ plane, the case where the Y-axis is inclined at approximately −10° to +10° to the direction of a normal line to an XZ plane, and the case where the Z-axis is inclined at approximately −10° to +10° to the direction of a normal line to an XY plane.

A physical quantity sensor 1 shown in FIGS. 1 to 4 is an acceleration sensor configured to measure an acceleration Az in the Z-axis direction. Such a physical quantity sensor 1 has a substrate 2, an element part 3 arranged at the top of the substrate 2, and a lid 5 covering the element part 3 and bonded to the substrate 2. These components will now be sequentially described in detail.

The substrate 2 is plate-shaped and has a recess 21 opening to an upper surface side. As viewed in a plan view from the Z-axis direction, the recess 21 is formed to be larger than the element part 3 so as to contain the element part 3 inside. The recess 21 functions as a clearance part that prevents contact between the element part 3 and the substrate 2. The recess 21 has a first recess 211 and a second recess 212 located on the positive side of the X-axis direction of the first recess 211 and deeper than the first recess 211. Therefore, a gap Q between the substrate 2 and the element part 3 includes a first gap Q1 overlapping the first recess 211, and a second gap Q2 overlapping the second recess 212 and having a longer length in the Z-axis direction than the first gap Q1 and therefore a longer distance between the substrate 2 and the element part 3.

The substrate 2 also has a protruding mount 22 provided at a bottom surface of the first recess 211. A fixed part 31 of the element part 3 is bonded to an upper surface of the mount 22. Thus, the element part 3 can be fixed to the substrate 2, in the state of being spaced apart from the bottom surface of the recess 21. The substrate 2 also has grooves 25, 26, 27 located around the recess 21 and opening to the upper surface side.

As the substrate 2, a glass substrate formed of, for example, a glass material containing an alkali metal ion (mobile ion such as $Na^+$), for example, a borosilicate glass such as Pyrex glass (trademark registered) or Tempax glass (trademark registered), can be used. However, the substrate 2 is not particularly limited and may be, for example, a silicon substrate or ceramic substrate.

The substrate 2 also has an electrode 8. The electrode 8 includes a first fixed electrode 81, a second fixed electrode 82, and a dummy electrode 83 that are arranged at the bottom surface of the recess 21. The substrate 2 also has wirings 75, 76, 77 arranged in the grooves 25, 26, 27. One end of each of the wirings 75, 76, 77 is exposed outside the lid 5 and functions as an electrode pad P for electrical coupling to an external device. The wiring 75 is electrically coupled to the element part 3 and the dummy electrode 83. The wiring 76 is electrically coupled to the first fixed electrode 81. The wiring 77 is electrically coupled to the second fixed electrode 82.

As shown in FIG. 2, the lid 5 is plate-shaped and has a recess 51 opening to a lower surface side. The lid 5 accommodates the element part 3 inside the recess 51 and is bonded to the upper surface of the substrate 2. The lid 5 and the substrate 2 together form an accommodation space S accommodating the element part 3 inside. The accommodation space S is an airtight space. The accommodation space S is sealed and filled with an inert gas such as nitrogen, helium or argon and has a substantially barometric pressure at operating temperatures, for example, approximately −40° C. to 120° C. However, the atmosphere in the accommodation space S is not particularly limited and may be, for example, a pressure-reduced state or a pressurized state.

As the lid 5, for example, a silicon substrate can be used. However, the lid 5 is not particularly limited and may be, for example, a glass substrate or ceramic substrate. The method for bonding the substrate 2 and the lid 5 together is not particularly limited, either. A suitable method may be selected according to the materials of the substrate 2 and the lid 5. For example, anodic bonding, activated bonding in which bonding surfaces activated by plasma irradiation are bonded together, bonding with a bonding material such as a glass frit, diffusion bonding in which metal films formed at the upper surface of the substrate 2 and the lower surface of the lid 5 are bonded together, or the like, can be used. In this embodiment, the substrate 2 and the lid 5 are bonded together with a glass frit 59 formed of a low-melting-point glass.

Preferably, the lid 5 is coupled to the ground. Thus, the electric potential of the lid 5 can be kept constant and, for example, change in the electrostatic capacitance between the lid 5 and the element part 3 can be reduced. The distance between the bottom surface of the recess 51 and the element part 3 is not particularly limited. However, preferably this distance is, for example, 15 μm or longer, more preferably 20 μm or longer, and even more preferably 25 μm or longer. Thus, the electrostatic capacitance between the lid 5 and the element part 3 can be made sufficiently low and the acceleration Az can be detected more accurately.

As shown in FIGS. 1 and 2, the element part 3 has the fixed part 31 bonded to the upper surface of the mount 22, a plate-like moving member 32 that is displaceable in relation to the fixed part 31, and a support beam 33 coupling the fixed part 31 and the moving member 32 together. When the acceleration Az acts on the physical quantity sensor 1, the moving member 32 swings about the support beam 33 as a rotation axis J while torsionally deforming the support beam 33.

Such an element part 3 is formed, for example, by patterning an electrically conductive silicon substrate doped with an impurity such as phosphorus (P), boron (B), or arsenic (As), by dry etching. However, the method for forming the element part 3 is not particularly limited. The element part 3 is bonded to the upper surface of the substrate 2 by anodic bonding. However, the material of the element part 3 and the method for bonding the element part 3 and the substrate 2 together are not particularly limited.

The moving member 32 has an elongated shape along the X-axis direction as viewed in a plan view, and particularly in this embodiment, has a rectangular shape with its long sides laid along the X-axis direction. The moving member 32 has a first mass part 321 located on the negative side of the X-axis direction in relation to the rotation axis J, a second mass part 322 located on the positive side of the X-axis direction in relation to the rotation axis J, and a coupling part 323 coupling the first mass part 321 and the second mass part 322 together. The moving member 32 is coupled to the support beam 33 at the coupling part 323.

The second mass part 322 is longer in the X-axis direction than the first mass part 321 and has a greater moment of rotation, that is, a greater torque, than the first mass part 321 when the acceleration Az is applied. Due to this difference in the moment of rotation, the moving member 32 swings about the rotation axis J when the acceleration Az is applied. In the description below, a proximal part of the second mass part 322 that is symmetrical with the first mass part 321 about the rotation axis J is also referred to as a "base part 322A", which is a first part, and a distal part of the second mass part 322 that is asymmetrical with the first mass part 321 about the rotation axis J is also referred to as a "torque generation part 322B". At a boundary part between the base part 322A and the torque generation part 322B, an opening 325 extending in the Y-axis direction is formed.

The moving member 32 also has an opening 324 located between the first mass part 321 and the second mass part 322. The fixed part 31 and the support beam 33 are arranged inside the opening 324. This configuration enables miniaturization of the element part 3. Also, the support beam 33 extends along the Y-axis direction and forms the rotation axis J. However, the arrangement of the fixed part 31 and the support beam 33 is not particularly limited and may be located, for example, at the outside of the moving member 32.

Of the moving member 32 having such a configuration, the first mass part 321 and the base part 322A of the second mass part 322 overlap the first recess 211 as viewed in a plan view from the Z-axis direction, and the torque generation part 322B of the second mass part 322 overlaps the second recess 212 as viewed in the plan view from the Z-axis direction.

The electrode 8 will now be described. As described above, the electrode 8 has the first fixed electrode 81, the second fixed electrode 82, and the dummy electrode 83. As shown in FIGS. 1 and 2, the first fixed electrode 81 is arranged in the first recess 211 and faces the first mass part 321. The second fixed electrode 82 is arranged in the first recess 211 and faces the base part 322A of the second mass part 322. The first and second fixed electrodes 81, 82 are arranged symmetrically about the rotation axis J, as viewed in a plan view from the Z-axis direction.

The dummy electrode 83 is located on the positive side of the X-axis direction of the second fixed electrode 82 and arranged in the second recess 212 and faces the torque generation part 322B of the second mass part 322. The dummy electrode 83 is also located on the negative side of the X-axis direction of the first fixed electrode 81. Providing the dummy electrode 83 can restrain the bottom surface of the recess 21 from being charged due to the migration of alkali metal ions in the substrate 2. Therefore, an unintended electrostatic attraction that may lead to a malfunction of the moving member 32, particularly, a displacement by an external force other than the acceleration Az that is a detection target, can be effectively restrained from occurring between the bottom surface of the recess 21 and the moving member 32. Thus, the physical quantity sensor 1 can detect the acceleration Az more accurately.

To drive the physical quantity sensor 1, a predetermined drive voltage is applied to the element part 3, and each of the first fixed electrode 81 and the second fixed electrode 82 is coupled to a QV amplifier (charge-voltage converter circuit), not illustrated. Thus, an electrostatic capacitance Ca is formed between the first fixed electrode 81 and the first mass part 321, and an electrostatic capacitance Cb is formed between the second fixed electrode 82 and the base part 322A of the second mass part 322, as shown in FIG. 2.

When the acceleration Az is applied to the physical quantity sensor 1, the moving member 32 swings about the rotation axis J while torsionally deforming the support beam 33, due to the difference in the moment of rotation between the first and second mass parts 321, 322. Such swinging of the moving member 32 causes the gap between the first mass part 321 and the first fixed electrode 81 and the gap between the base part 322A of the second mass part 322 and the second fixed electrode 82 to change in the opposite phases. The electrostatic capacitances Ca, Cb change in the opposite phases accordingly. Thus, the physical quantity sensor 1 can detect the acceleration Az, based on the amount of change in the electrostatic capacitances Ca, Cb, more specifically, the difference between the electrostatic capacitances Ca, Cb.

As described above, the recess 21 has the first recess 211 overlapping the rotation axis J as viewed in a plan view from the Z-axis direction, and the second recess 212 located on the positive side of the X-axis direction of the first recess 211 and deeper than the first recess 211. That is, the depth of the recess 21, that is, the distance between the recess 21 and the moving member 32, becomes greater as it goes away from the rotation axis J. Thus, the distance between the moving member 32 and the first and second fixed electrodes 81, 82 is reduced while the contact between the moving member 32 and the substrate 2 when the moving member 32 swings is restrained. Therefore, the electrostatic capacitances Ca, Cb are increased and the accuracy of detecting the acceleration Az is improved.

As shown in FIGS. 1, 3 and 4, the physical quantity sensor 1 has a protrusion 6 protruding from the bottom surface of the recess 21 toward the moving member 32. The protrusion 6 functions as a stopper coming into contact with the moving member 32 when the moving member 32 swings excessively and thus regulating further swinging of the moving member 32. As the protrusion 6 is provided, the moving member 32 and the first and second fixed electrodes 81, 82 having different electric potentials from each other can be restrained from excessively approaching each other or coming into contact with each other over a broad area. Therefore, the occurrence of a "sticking" of the moving member 32 remaining attracted to the first and second fixed electrodes 81, 82 and not returning to the original position due to the electrostatic attraction generated between the moving member 32 and the first and second fixed electrode 81, 82 can be effectively restrained. In this embodiment, the protrusion 6 is formed as integrated with the substrate 2, that is, forms a part of the substrate 2. However, the protrusion 6 is not limited to this configuration and may be formed as a separate part from the substrate 2.

The protrusion 6 includes a protrusion 61 provided overlapping the first mass part 321, and a protrusion 62 provided overlapping the base part 322A of the second mass part 322, as viewed in a plan view from the Z-axis direction. Of these protrusions, the protrusion 61 restrains the moving member 32 and the first fixed electrode 81 from excessively approaching each other, and the protrusion 62 restrains the moving member 32 and the second fixed electrode 82 from excessively approaching each other. Each of the protrusions 61, 62 is provided in a pair spaced apart in the Y-axis direction. The pair of protrusions 61 and the pair of protrusions 62 are arranged symmetrically with each other about the rotation axis J, as viewed in a plan view from the Z-axis direction.

As shown in FIGS. 3 and 4, the protrusions 61, 62 are covered with the dummy electrode 83 having the same electric potential as the moving member 32. This configuration can restrain the surface of the protrusions 61, 62 from being charged due to the migration of alkali metal ions in the substrate 2. Therefore, an unintended electrostatic attraction that may lead to a malfunction of the moving member 32, particularly, a displacement by an external force other than the acceleration Az that is a detection target, can be effectively restrained from occurring between the protrusions 61, 62 and the moving member 32. Since the dummy electrode 83 covering the protrusions 61, 62 has the same electric potential as the moving member 32, the occurrence of an unwanted electrostatic attraction and sticking between the dummy electrode 83 and the moving member 32 can be restrained. Thus, the physical quantity sensor 1 can detect the acceleration Az more accurately.

In this embodiment, a pair of cut-outs 811 extending from the end on the negative side of the X-axis direction of the first fixed electrode 81 to the respective protrusions 61 are formed in the first fixed electrode 81, and the dummy electrode 83 is made to extend in the respective cut-outs 811, as shown in FIG. 3. Thus, the dummy electrode 83 covers the protrusions 61. Similarly, a pair of cut-outs 821 extending from the end on the positive side of the X-axis direction of the second fixed electrode 82 to the respective protrusions 62 are formed in the second fixed electrode 82, and the dummy electrode 83 is made to extend in the respective cut-outs 821. Thus, the dummy electrode 83 covers the protrusions 62.

However, the method of covering of the protrusions 61, 62 with the dummy electrode 83 is not particularly limited. The protrusion 61 may be covered with the first fixed electrode 81 or may be laid bare without being covered with the electrode 8. Similarly, the protrusion 62 may be covered with the second fixed electrode 82 or may be laid bare without being covered with the electrode 8. Also, the protrusion 6 may be omitted.

Back to the description of the moving member 32, the moving member 32 has a first region R1 having a plurality of penetration holes 30 penetrating the moving member 32 in the direction of the thickness thereof along the Z-axis, and a second region R2 having no penetration hole 30, as shown in FIGS. 1, 2 and 4. Since the moving member 32 has the first region R1 having the penetration hole 30, the damping of a gas when the moving member 32 swings is reduced and the vibration characteristic of the moving member 32 is improved. Meanwhile, since the moving member 32 has the second region R2 having no penetration hole 30, the damping is increased, making the moving member 32 less likely to vibrate in a high-frequency region. Also, not forming the penetration hole 30 reinforces the moving member 32 that is reduced in strength. Therefore, the moving member 32 is made less likely to vibrate in a high-frequency region and is effectively restrained from being damaged even when a strong vibration in a high-frequency region is applied.

As shown in FIG. 1, each of the plurality of penetration holes 30 formed in the first region R1 has a square opening shape as viewed in a plan view and has a pair of sides extending in the X-axis direction and a pair of sides extending in the Y-axis direction. The plurality of penetration holes 30 are evenly arranged over the entire area of the first region R1. The plurality of penetration holes 30 are regularly arranged as viewed in a plan view, and particularly in this embodiment, arranged in a matrix laid along the X-axis direction and the Y-axis direction. The plurality of penetration holes 30 are the same size as each other.

The meaning of the term "evenly" includes not only the case where the distance between the penetration holes 30 next to each other in the X-axis direction and the Y-axis direction is equal among all the penetration holes 30 but also the case where the distance between some penetration holes 30 is slightly different from the distance between the other penetration holes 30, for example, by approximately 10% or less, in consideration of an error or the like that can occur in manufacturing. Similarly, the term "square" means being substantially square and includes not only a complete square but also a shape slightly different from a square, for example, a square-like shape with the four corners chamfered or rounded, with at least one corner deviated from 90° by a range of approximately ±10°, with at least one side having a slightly different length from the other sides, or with an opening having an aspect ratio within a range of approximately 1:1.1 to 1.1:1, in consideration of an error or the like that can occur in manufacturing.

The design of the penetration hole 30 in the first region R1 will now be described specifically. The penetration hole 30 is provided to control the damping of a gas when the moving member 32 swings. As shown in FIG. 5, the damping includes hole damping of a gas passing through the penetration hole 30 and squeeze film damping between the moving member 32 and the substrate 2.

Making the penetration hole 30 larger facilitates the passage of a gas through the penetration hole 30 and therefore can reduce the hole damping. Also, increasing the occupancy rate of the penetration hole 30 reduces the facing area between the moving member 32 and the substrate 2 and therefore reduces the squeeze film damping. However, at the same time, as the facing area between the moving member 32 and the first and second fixed electrodes 81, 82 decreases, the mass of the torque generation part 322B decreases, resulting in a drop in the sensitivity of detecting the acceleration Az. On the other hand, making the penetration holes 30 smaller, that is, reducing the occupancy rate, increases the facing area between the moving member 32 and the first and second fixed electrodes 81, 82, and increases the mass of the torque generation part 322B, resulting in an improvement in the sensitivity of detecting the acceleration Az. However, the damping increases. In this way, the sensitivity of detection and the damping are in a trade-off relationship.

In the physical quantity sensor 1, the design of the penetration hole 30 is contrived to achieve both improvement in the sensitivity of detection and reduction of the damping. This designing will now be described specifically. The sensitivity of detection of the physical quantity sensor 1 is proportional to (A) $1/h^2$, where h is the distance between the moving member 32 and the bottom surface of the recess 21, more precisely, the surface of the electrode 8, (B) the facing area between the moving member 32 and the first and second fixed electrodes 81, 82, (C) $1/k$, where k is the spring stiffness of the support beam 33, and (D) the mass of the torque generation part 322B. The spring stiffness of the support beam 33 is proportional to the length H in the Z-axis direction of the penetration hole 30 when the thickness of the moving member 32 is uniform. In the physical quantity sensor 1, first, in the state where the damping is ignored, H and h necessary to achieve a required sensitivity of detection, and the facing area between the moving member 32 and the first and second fixed electrodes 81, 82, that is, the occupancy rate of the penetration hole 30 in the first mass part 321 and the base part 322A, are decided. Thus, the electrostatic capacitances Ca, Cb of a required magnitude are formed and the physical quantity sensor 1 achieves a sufficient sensitivity of detection.

The occupancy rate of the penetration holes 30 in the first region R1 is not particularly limited but is preferably 75% or higher, more preferably 78% or higher, and even more preferably 82% or higher. Thus, both improvement in the sensitivity of detection and reduction of the damping are achieved more easily.

After the occupancy rate of the penetration holes 30 in the first mass part 321 and the base part 322A is decided in this way, designing with respect to damping is performed separately for the respective parts having different distances h between the bottom surface of the recess 21 and the element part 3, that is, the first mass part 321 and the base part 322A, and the torque generation part 322B.

As a novel technical idea for minimizing the damping without changing the sensitivity, in the physical quantity sensor 1, the plurality of penetration holes 30 are designed in such a way that the difference between the hole damping and the squeeze film damping shown in FIG. 5 becomes as little as possible, preferably, in such a way that the hole damping and the squeeze film damping become equal. Making the difference between the hole damping and the squeeze film damping as little as possible in this way can reduce the damping. When the hole damping and the squeeze film damping are equal, the damping is minimum. Therefore, the physical quantity sensor 1 can maintain a sufficiently high sensitivity of detection and can effectively reduce the damping.

The damping designing method is similar among the first mass part 321, the base part 322A, and the torque generation part 322B. Therefore, the damping design for the first mass part 321 is described below as a representative example. The description of the damping design for the base part 322A and the torque generation part 322B is omitted.

A damping C generated in the first mass part 321 is expressed by the following formula (2).

$$C = 2aL \frac{8\mu H}{\beta^2 r_o^2} \left(1 + \frac{3r_o^4 K(\beta)}{16Hh^3}\right)\left[1 - \frac{l}{a}\tanh\left(\frac{a}{l}\right)\right] \quad (2)$$

In the formula (2), as shown in FIGS. 1 and 2, H [m] is the length along the Z-axis of the penetration hole 30 arranged in the first region R1 in the first mass part 321 (thickness of the moving member 32), a [m] is half the length along the Y-axis direction of the first mass part 321, L [m] is the length along the X-axis direction, h [m] is the distance between the first fixed electrode 81 and the first mass part 321, S0 [m] is the length of one side of the square of the penetration hole 30, S1 [m] is the space between penetration holes 30 next to each other in the X-axis direction or the Y-axis direction, p [kg/ms] is the viscous resistance (coefficient of viscosity) of a gas in the first gap Q1, that is, a gas filling the accommodation space S, and C is the damping generated in the first mass part 321. The formula (2) is similar to a formula (1).

The parameters used in the formula (2) are expressed by the following formulae (3) to (9).

$$H_{eff} = H + \frac{3\pi r_o}{8} \quad (3)$$

$$l = \sqrt{\frac{2h^3 H_{eff} \eta(\beta)}{3\beta^2 r_o^2}} \quad (4)$$

$$\eta(\beta) = 1 + \frac{3r_o^4 K(\beta)}{16Hh^3} \quad (5)$$

$$K(\beta) = 4\beta^2 - \beta^4 - 4\ln\beta - 3 \quad (6)$$

$$\beta = \frac{r_o}{r_c} \quad (7)$$

$$r_c = \frac{S0 + S1}{\sqrt{\pi}} \quad (8)$$

$$r_0 = 0.547 \times S0 \quad (9)$$

The hole damping component included in the formula (2) is expressed by the following formula (10), and the squeeze film damping component is expressed by the following formula (11).

$$2aL\frac{8\mu H}{\beta^2 r_o^2}\left[1 - \frac{l}{a}\tanh\left(\frac{a}{l}\right)\right] \quad (10)$$

$$2aL\frac{8\mu H}{\beta^2 r_o^2}\left(\frac{3r_o^4 K(\beta)}{16Hh^3}\right)\left[1 - \frac{l}{a}\tanh\left(\frac{a}{l}\right)\right] \quad (11)$$

Therefore, using the dimensions H, h, S0, S1 equalizing the formula (10) and the formula (11), that is, satisfying the following formula (12), minimizes the damping C.

$$\frac{3r_o^4 K(\beta)}{16Hh^3} = 1 \quad (12)$$

Now, the length S0 of one side of the penetration hole 30 satisfying the formula (12) is defined as S0min. The space S1 between the penetration holes 30 next to each other is defined as S1min. The damping C when S0min and S1min are substituted into the formula (2), that is, the minimum value of the damping C, is defined as Cmin.

Although it depends on the accuracy required of the physical quantity sensor 1, in the first mass part 321 and the base part 322A of the second mass part 322, preferably, the range of S0, S1 may satisfy the following formula (13) when H and h are constant. More preferably, the range of S0, S1 may satisfy the following formula (14), even more preferably the following formula (15), and most preferably the following formula (16). This can sufficiently reduce the damping in the moving member 32, maintain the sensitivity of detection within a desired range, and reduce the noise.

$$C \leq 1.5 \times Cmin \quad (13)$$

$$C \leq 1.4 \times Cmin \quad (14)$$

$$C \leq 1.3 \times Cmin \quad (15)$$

$$C \leq 1.2 \times Cmin \quad (16)$$

FIG. 6 is a graph showing the relationship between the length S0 of one side of the penetration hole 30 and the damping. It is assumed that H and h are constant and that the S1/S0 ratio is 1 so as to achieve a constant sensitivity. This means that the aperture ratio does not change even when the value of S0 is changed. From this graph, it can be understood that the damping of the formula (2) can be separated into the squeeze film damping of the formula (11) and the hole damping of the formula (10), that the hole damping is dominant in a region where S0 is smaller than S0min, and that the squeeze film damping is dominant in a region where S0 is greater than S0min. S0 satisfying the formula (13) ranges from S0', which is smaller than S0min, to S0", which is greater than S0min.

The torque generation part 322B of the second mass part 322 is provided at a distant site from the rotation axis J. Therefore, the moving member 32 is displaced more greatly at the torque generation part 322B than at the first mass part 321 and the base part 322A and cannot avoid having a greater damping. However, preferably, the range of S0, S1 may satisfy the following formula (17) when H and h are constant. More preferably, the range of S0, S1 may satisfy the following formula (18), even more preferably the following formula (19), and most preferably the following formula (20). Thus, the damping in the moving member 32 can be sufficiently reduced. Also, the mass of the torque generation part 322B is secured more easily and a drop in the sensitivity of detection is restrained.

$$C \leq 2.5 \times Cmin \quad (17)$$

$$C \leq 2.3 \times Cmin \quad (18)$$

$$C \leq 2.0 \times Cmin \quad (19)$$

$$C \leq 1.5 \times Cmin \quad (20)$$

The relationship of S0, S1 is not particularly limited but may preferably satisfy the following formula (21), more preferably the following formula (22), and even more preferably the following formula (23). Satisfying such relationships enables well-balanced formation of the penetration holes 30 in the moving member 32.

$$0.25 \leq S1/S0 \leq 3.00 \quad (21)$$

$$0.6 \leq S1/S0 \leq 2.40 \quad (22)$$

$$0.8 \leq S1/S0 \leq 2.00 \quad (23)$$

FIG. 7 is a graph showing the relationship between S1/S0, and sensitivity ratio and minimum damping ratio. The sensitivity ratio is the ratio to the sensitivity where S1/S0=1. The minimum damping is the ratio to the minimum damping where S1/S0=1. As can be understood from FIG. 7, where S1/S0>3, the rate of increase in the sensitivity ratio tends to reach saturation, and the minimum damping ratio tends to increase significantly. Therefore, satisfying the formulae (21) to (23) enables sufficient increase in the sensitivity of detection and sufficient reduction of the damping.

Figure 17:
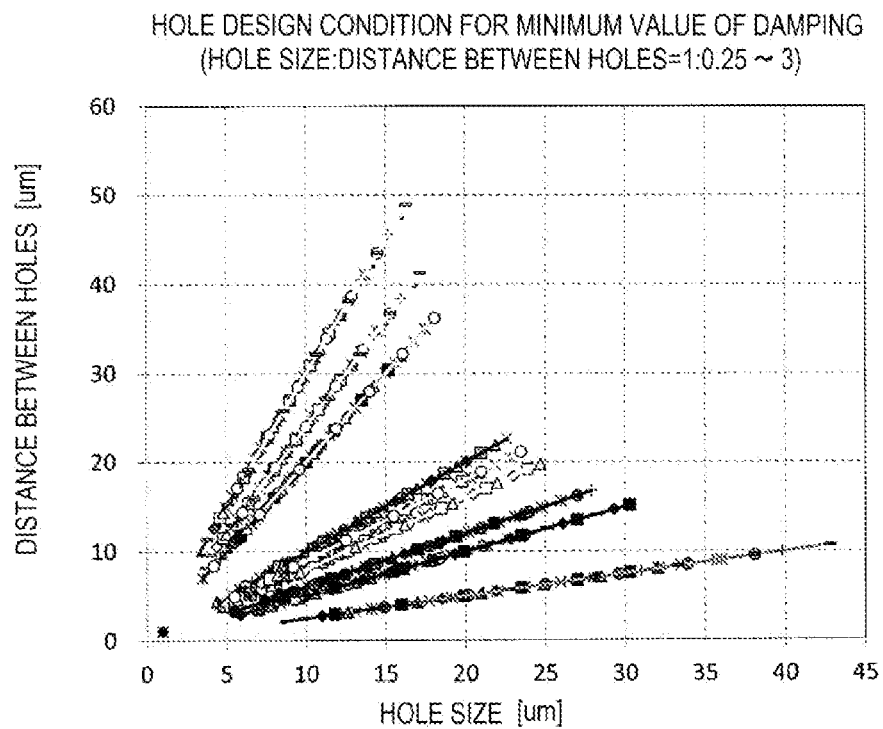
FIG. 17 is a graph showing the relationship between S0min, S1min and H, h.
Figure 18:
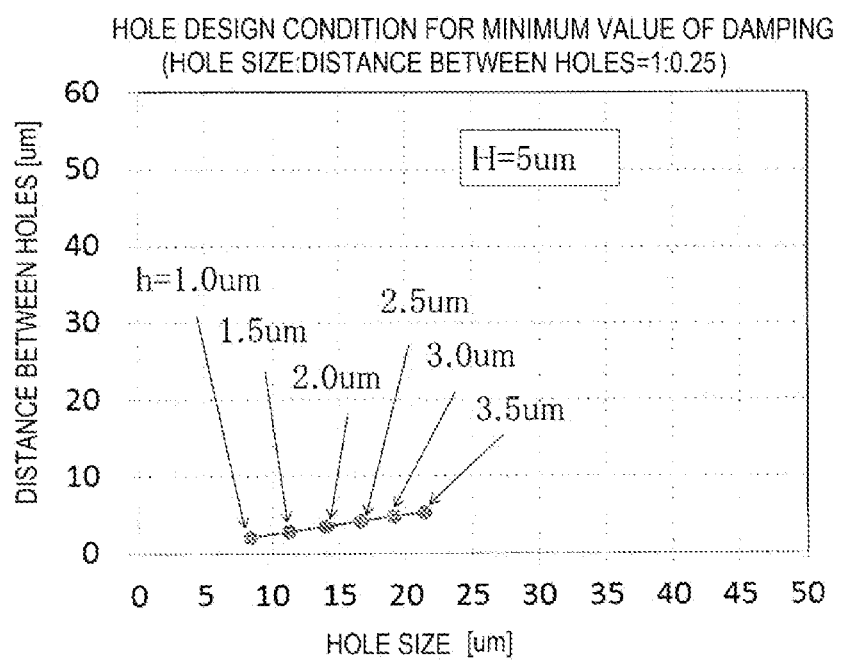
FIG. 18 is a graph showing the relationship between S0min, S1min and H, h.
Figure 19:
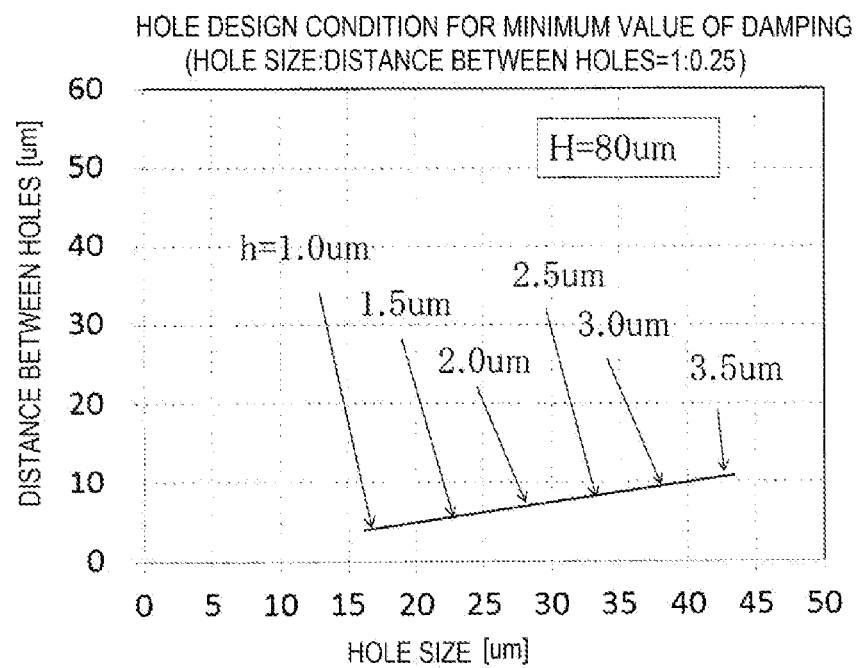
FIG. 19 is a graph showing the relationship between S0min, S1min and H, h.

A simulation and experimental verification about the dimensional ratio S1/S0 in the process of deriving the ranges expressed by the formulae (21) to (23) will now be described in detail. FIGS. 8 to 16 are graphs showing plotted values of the hole size and the distance between holes that achieve S0min, S1min, where H is 5 to 80 μm, h is 1.0 to 3.5 μm, and S1/S0 is 0.25 to 3.0. FIG. 17 is a graph collectively showing the values of S0min, Smin1 acquired in FIGS. 8 to 16, where the horizontal axis represents S0 and the vertical axis represents S1. FIG. 18 shows an example of S0min, S1min acquired where S1/S0=0.25, H=5 μm, and h=1.0 to 3.5 μm. FIG. 19 shows S0min, S1min acquired where S1/S0=0.25, H=80 μm, and h=1.0 to 3.5 μm. From FIGS. 18 and 19, it is understood that the dimensions of S0min, S1min tend to become larger as H or h becomes greater.

Figure 20:
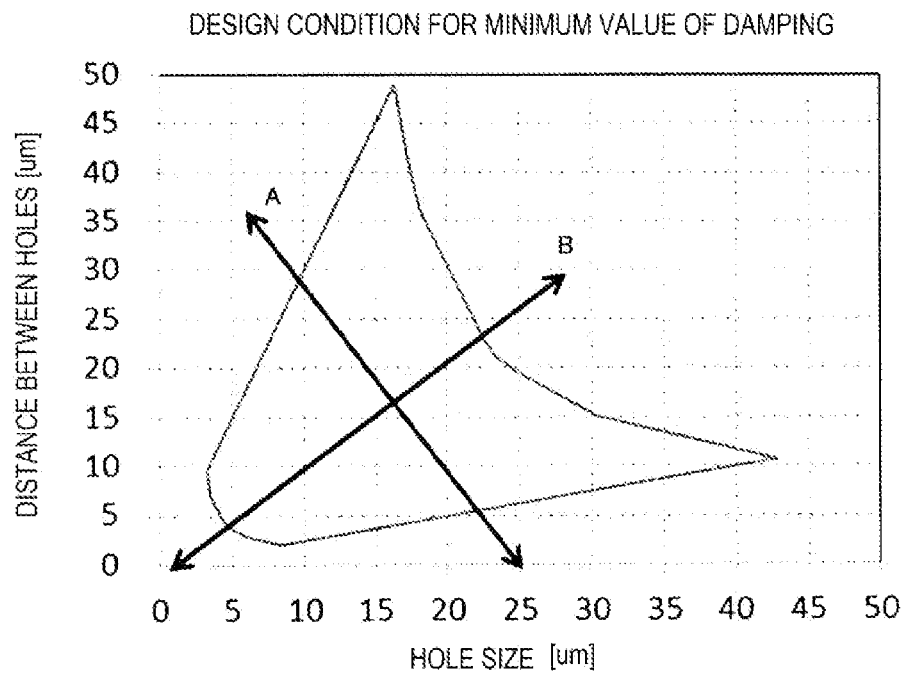
FIG. 20 is a graph showing the relationship between S1min/S0min and H, h.
Figure 21:
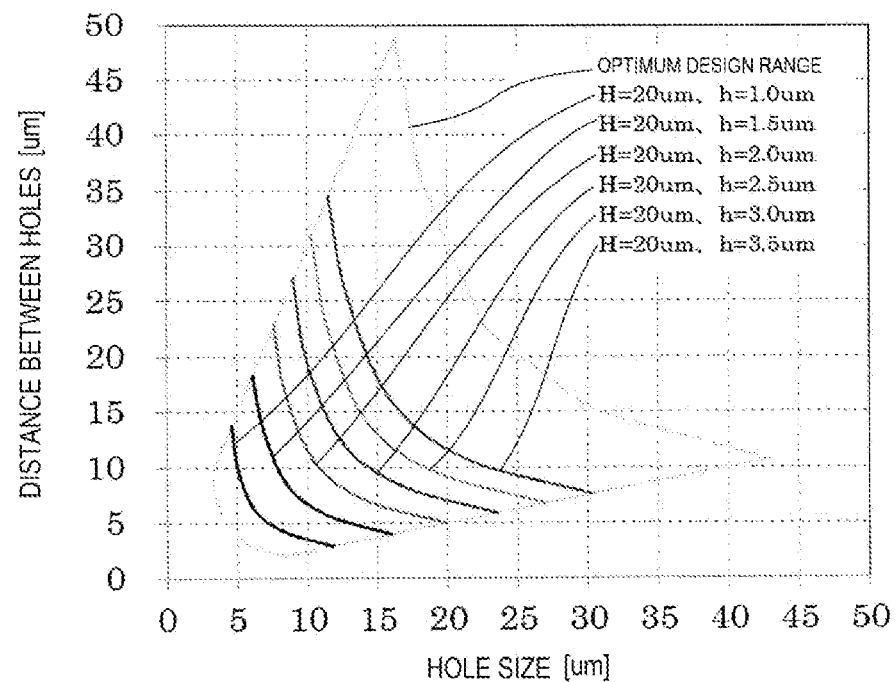
FIG. 21 is a graph showing the relationship between S1min/S0min and H, h.
Figure 22:
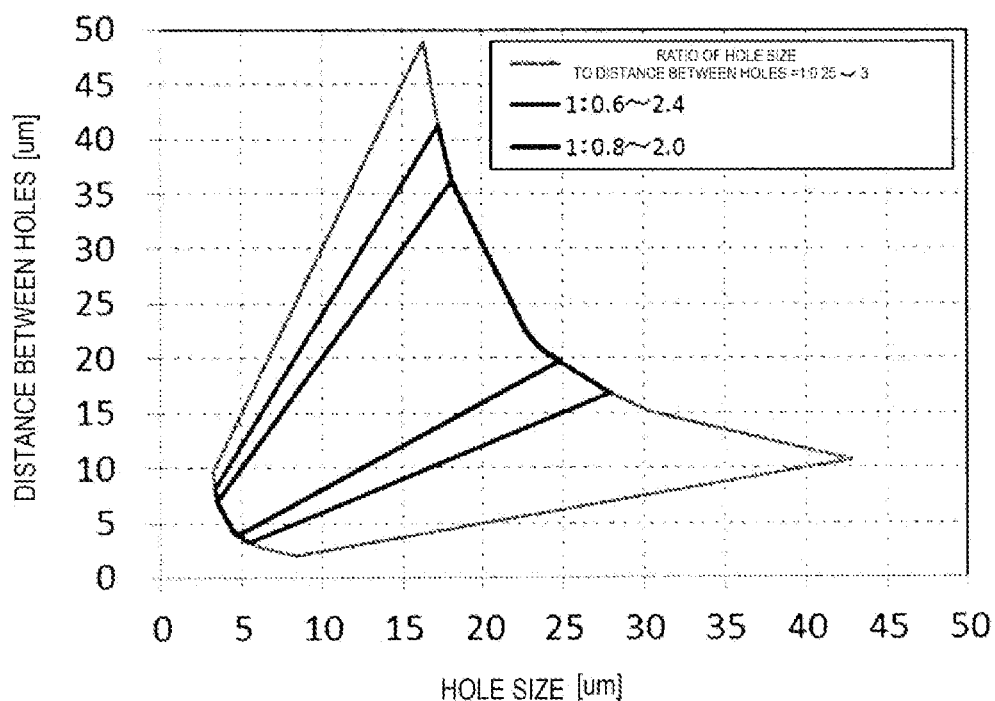
FIG. 22 is a graph showing the relationship between S1min/S0min and H, h.
Figure 23:
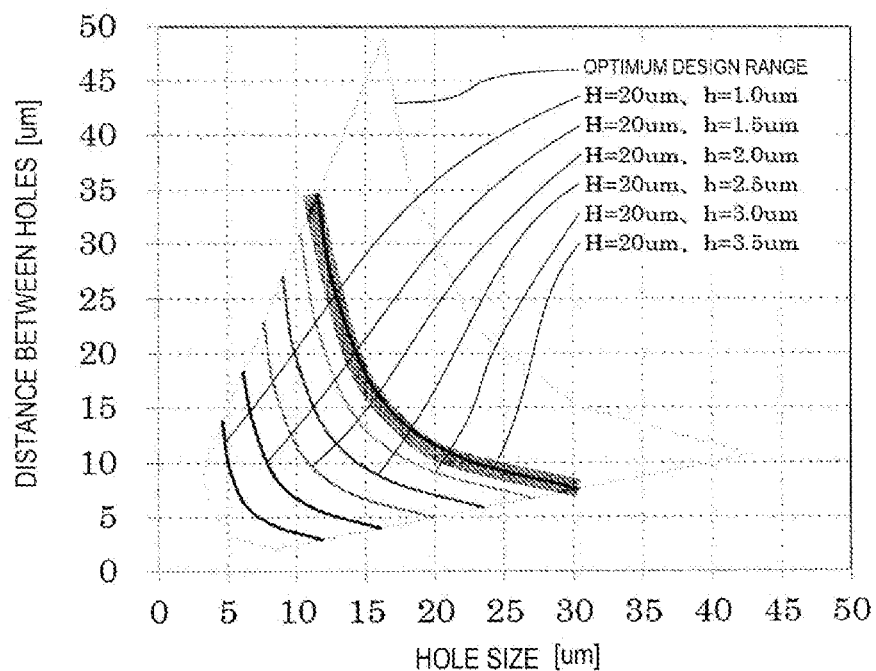
FIG. 23 is a graph showing the relationship between S1min/S0min and H, h.

FIG. 20 shows a range of all the points of S0min, S1min where H is 5 to 80 μm, h is 1.0 to 3.5 μm, and S1/S0 is 0.25 to 3.0. The direction of an arrow A is decided by the range of S1/S0. The direction of an arrow B is decided by the range of H, h. For example, the conditions for S0min, S1min where S1min/S0min=0.25 to 3.0, H=20 μm, and h=1.0 to 3.5 μm are as shown in FIG. 21. FIG. 22 shows regions to which S1min/S0min is limited within the ranges of the formulae (21) to (23), respectively, where H=5 to 80 μm and h=1.0 to 3.5 μm.

Up to this point, S0min, S1min have been described. However, as for S0, S1 that fall within the range of the formulae (13) to (23), for example, when the case where H=20 μm and h=3.5 μm is considered, the range includes the peripheries of S0min, S1min and therefore results in the range shown in FIG. 23, that is, as a whole, a range extended only on two sides.

The length H in the Z-axis direction of the penetration hole 30, that is, the thickness of the moving member 32, is not particularly limited but may be preferably, for example, 5.0 μm or longer and 80.0 μm or shorter. This allows the moving member 32 to maintain mechanical strength and be sufficiently thin. Thus, the physical quantity sensor 1 can be miniaturized. The length h of the gap Q is not particularly limited but may be preferably, for example, 1.0 μm or longer and 3.5 μm or shorter. Thus, a sufficient movement range for the moving member 32 can be secured and the electrostatic capacitances Ca, Cb can be made sufficiently large. The length S0 is not particularly limited but may be preferably, for example, 5 μm or longer and 40 μm or shorter, and more preferably 10 μm or longer and 30 μm or shorter, though depending on the lengths a and L.

The design of the penetration hole 30 in the first region R1 has been described. The second region R2 will now be described. As described above, the penetration hole 30 is not formed in the second region R2. Providing such a second region R2 in the moving member 32 increases the mechanical strength of the moving member 32. Also, the squeeze film damping in the moving member 32 can be intentionally increased. Therefore, the Q value of the frequency characteristic of the physical quantity sensor 1 can be reduced in a high-frequency region, as shown in FIG. 24, thus making the moving member 32 less likely to vibrate in the high-frequency region. The moving member 32 is thus made less likely to vibrate in the high-frequency region and is effectively restrained from being damaged even when a strong vibration in the high-frequency region is applied.

Such a second region R2 is provided in the first mass part 321 and the base part 322A of the second mass part 322, as shown in FIG. 1. In the first mass part 321, a pair of second regions R2 are provided, spaced apart from each other in the Y-axis direction. One second region R2 overlaps one protrusion 61 and the other second region R2 overlaps the other protrusion 61, as viewed in a plan view from the Z-axis direction. That is, when the moving member 32 excessively swings, the first mass part 321 comes into contact with the protrusion 61 at the second region R2. In the base part 322A, a pair of second regions R2 are provided, spaced apart from each other in the Y-axis direction. One second region R2 overlaps one protrusion 62 and the other second region R2 overlaps the other protrusion 62, as viewed in a plan view from the Z-axis direction. That is, when the moving member 32 excessively swings, the second mass part 322 comes into contact with the protrusion 62 at the second region R2. The second region R2 has no penetration hole 30 formed therein and therefore has a higher mechanical strength than the first region R1 having the penetration hole 30 formed therein. Thus, as the second region R2 comes into contact with the protrusions 61, 62, damage to the moving member 32 due to the impact of contact can be effectively restrained.

The pair of second regions R2 provided in the first mass part 321 and the pair of second regions R2 provided in the base part 322A of the second mass part 322 are arranged symmetrically about the rotation axis J, as viewed in a plan view from the Z-axis direction. Thus, the moment of inertia about the rotation axis J can be equalized between the first mass part 321 and the base part 322A.

Each of the four second regions R2 is square-shaped as viewed in a plan view from the Z-axis direction and is formed by omitting the formation of 3×3 penetration holes 30, that is, 9 penetration holes 30 in total. A width Wx, which is the length in the X-axis direction of each second region R2, is 3×S0+4×S1. A width Wy, too, which is the length in the Y-axis direction, is 3×S0+4×S1. That is, the area of each second region R2 is $(3 \times S0+4 \times S1)^2 = 9 \times S0^2 + 16 \times S1^2 + 24 \times S0 \times S1$. The total area of the four second regions R2 is $4(3 \times S0+4 \times S1)^2 = 36 \times S0^2 + 64 \times S1^2 + 96 \times S0 \times S1$. Making the total area of the second regions R2 equal to or greater than $36 \times S0^2 + 64 \times S1^2 + 96 \times S0 \times S1$ sufficiently increases the squeeze film damping in the moving member 32 and restrains the amount of displacement of the moving member 32 in the high-frequency region to a sufficiently small amount.

The area of the second region R2 (the total area when there is a plurality of second regions R2) may be preferably 17100 μm² or smaller. Thus, a detectable frequency range, that is, a lowest detectable frequency, can be sufficiently secured. The lowest detectable frequency may be preferably, for example, approximately 500 Hz. Thus, the physical quantity sensor 1 can detect a vibration with a sufficiently low frequency and can be easily loaded in any electronic apparatus.

The physical quantity sensor 1 has been described above. However, the configuration of the physical quantity sensor 1 and particularly the configuration of the second region R2 are not particularly limited. At least one of the width Wx and the width Wy may be S0+2×S1 or more. That is, the above effect is achieved when Wx S0+2×S1 or Wy≥S0+2×S1 is satisfied. An example of such a configuration is a configuration as shown in FIG. 25, where each second region R2 is formed by omitting the formation of one penetration hole 30. That is, Wx=S0+2×S1 and Wy=S0+2×S1.

Also, for example, in a configuration shown in FIG. 26, each second region R2 is formed by omitting the formation of 5×5 penetration holes 30, that is, 25 penetration holes 30 in total, with its center being a part overlapping the protrusion 61, 62. Also, for example, in a configuration shown in FIG. 27, each second region R2 is formed by omitting the formation of 7×7 penetration holes 30, that is, 49 penetration holes 30 in total, with its center being a part overlapping the protrusion 61, 62. In this way, increasing the area of the second region R2 makes the moving member 32 less likely to vibrate in a high-frequency region.

FIG. 28 is a graph showing the result of random testing of vibration resistance of a configuration smp1 having no second region R2, a configuration smp2 according to this embodiment, a configuration smp3 shown in FIG. 26, and a configuration smp4 shown in FIG. 27. Here, on the assumption that the vibration resistance of the configuration smp1 is 1, the ratio of vibration resistance of the configurations smp2, smp3, smp4 is shown. It can be understood that each of the configurations smp2, smp3, smp4 having the second region R2 has a higher vibration resistance than the configuration smp1 having no second region R2.

The second region R2 may also be provided at a position not overlapping the protrusion 61, 62. For example, in a configuration shown in FIG. 29, the second region R2 is not provided in the first mass part 321 or the base part 322A of the second mass part 322 and is provided only in the torque generation part 322B. A pair of second regions R2 are provided, spaced apart from each other in the Y-axis direction. Each second region R2 is formed by omitting the formation of 5×5 penetration holes 30, that is, 25 penetration holes 30 in total.

Figure 30:
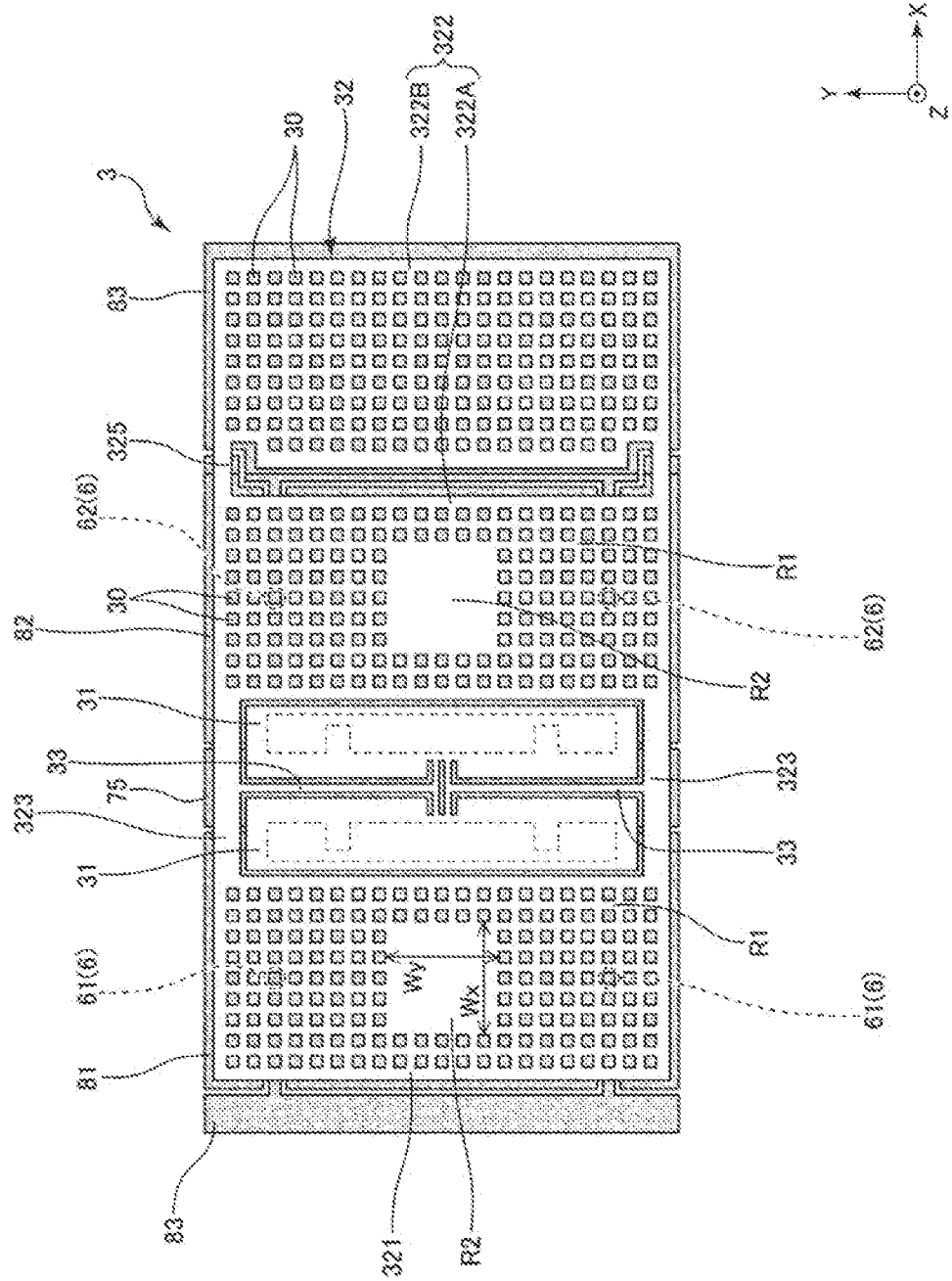
FIG. 30 is a plan view showing a modification example of the physical quantity sensor shown in FIG. 1.
Figure 31:
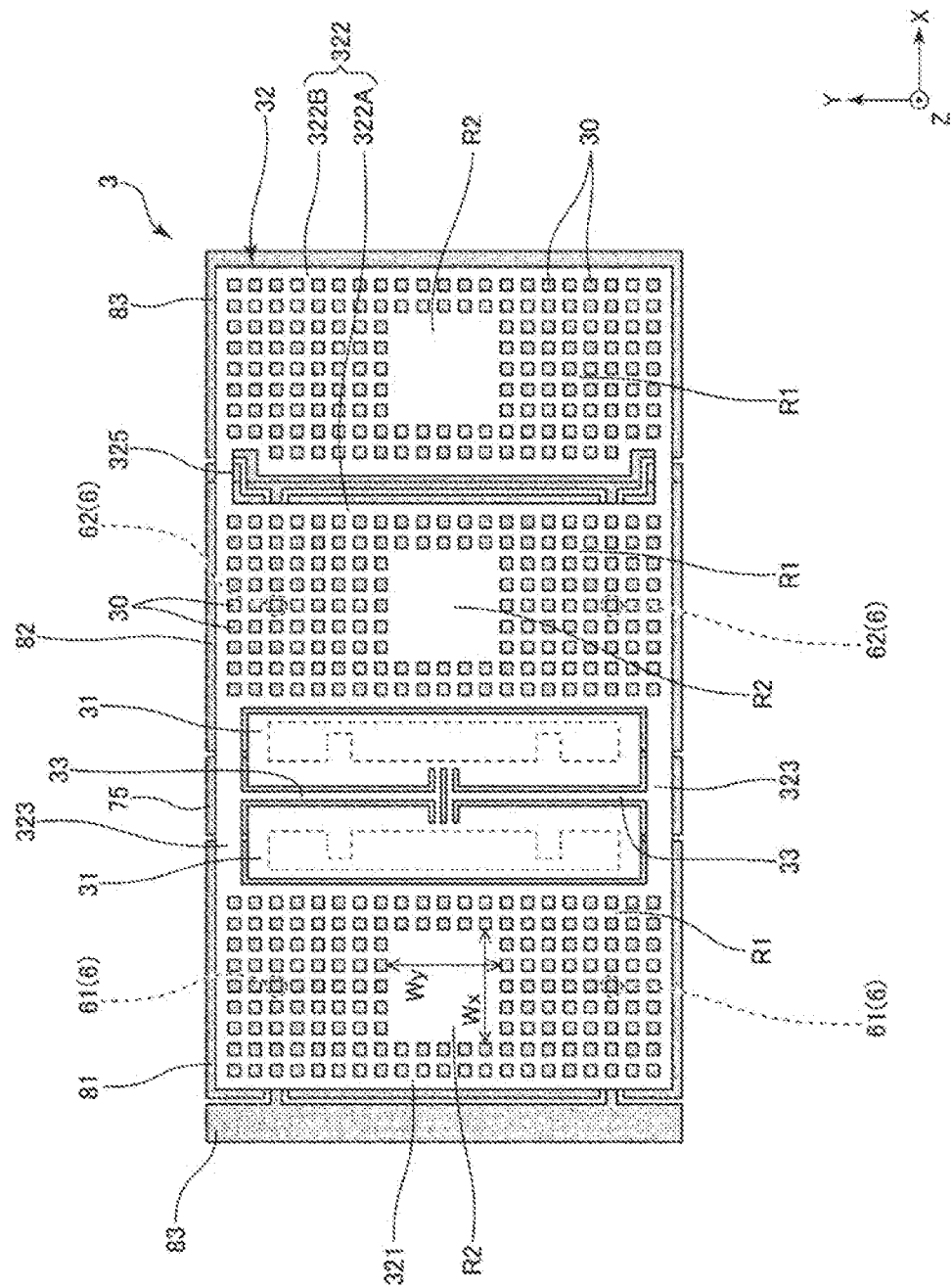
FIG. 31 is a plan view showing a modification example of the physical quantity sensor shown in FIG. 1.

Also, for example, in a configuration shown in FIG. 30, one second region R2 is provided in each of the first mass part 321 and the base part 322A of the second mass part 322. The second region R2 provided in the first mass part 321 is provided at a center part of the first mass part 321 in such a way as not to overlap the protrusion 61. The second region R2 provided in the base part 322A is provided at a center part of the base part 322A in such a way as not to overlap the protrusion 62. Each second region R2 is formed by omitting the formation of 5×5 penetration holes 30, that is, 25 penetration holes 30 in total. Also, for example, in a configuration shown in FIG. 31, a second region R2 is provided also in the torque generation part 322B in addition to the configuration shown in FIG. 30. The second region R2 provided in the torque generation part 322B is provided at a center part of the torque generation part 322B and is formed by omitting the formation of 5×5 penetration holes 30, that is, 25 penetration holes 30 in total, similarly to the second regions R2 provided in the first mass part 321 and the base part 322A.

Figure 32:
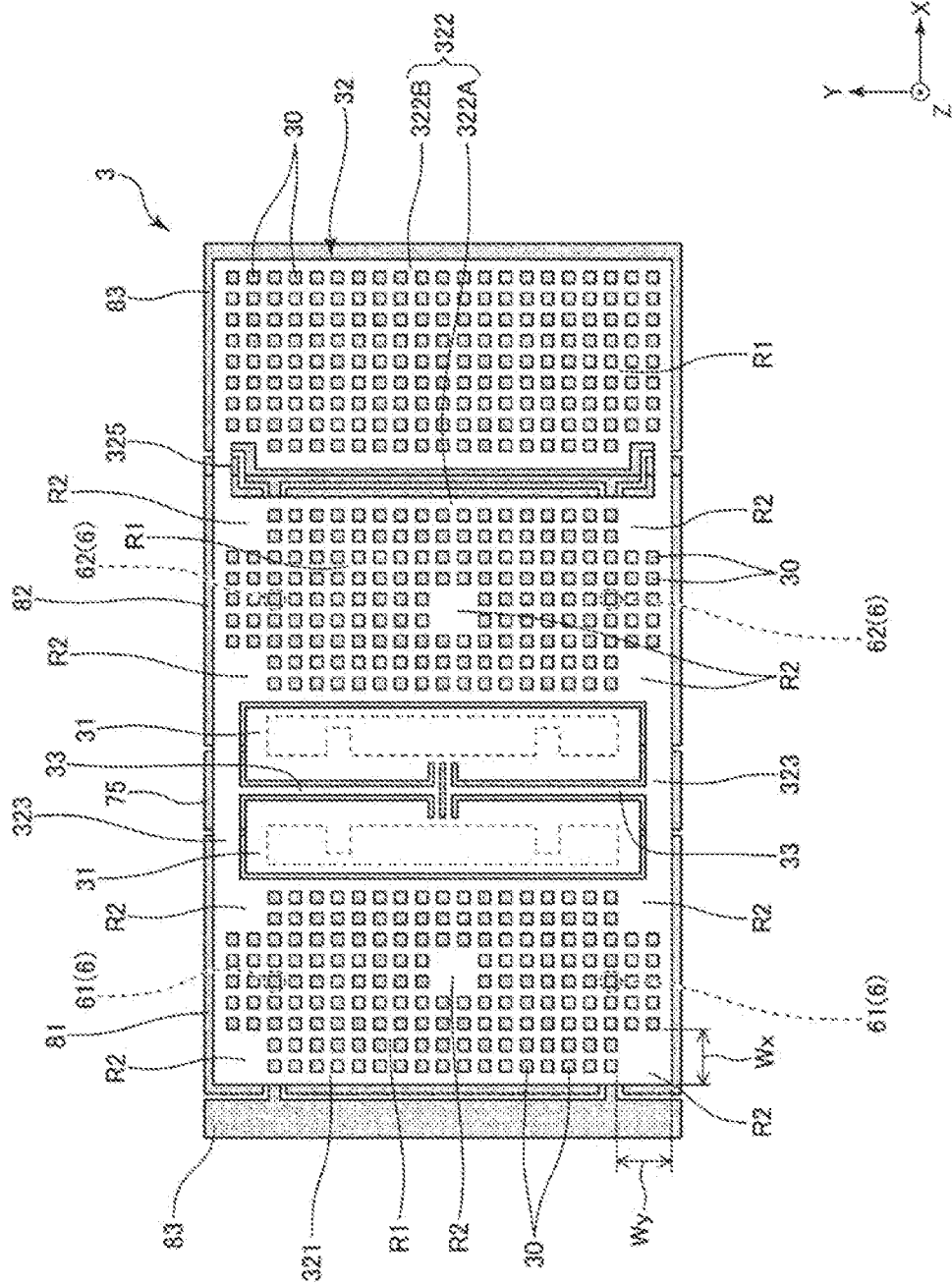
FIG. 32 is a plan view showing a modification example of the physical quantity sensor shown in FIG. 1.

Also, for example, in a configuration shown in FIG. 32, five second regions R2 are provided in each of the first mass part 321 and the base part 322A of the second mass part 322. The five second regions R2 provided in the first mass part 321 are dispersed at a center part and the four corners of the first mass part 321 in such a way as not to overlap the protrusion 61. The five second regions R2 provided in the base part 322A are similarly dispersed at a center part and the four corners of the base part 322A in such a way as not to overlap the protrusion 62. Arranging the second regions R2 in a well-balanced manner like this reduces uneven formation (sparsity and density) of the penetration holes 30 in the moving member 32. Thus, the accuracy of processing the penetration hole 30 is improved.

Figure 33:
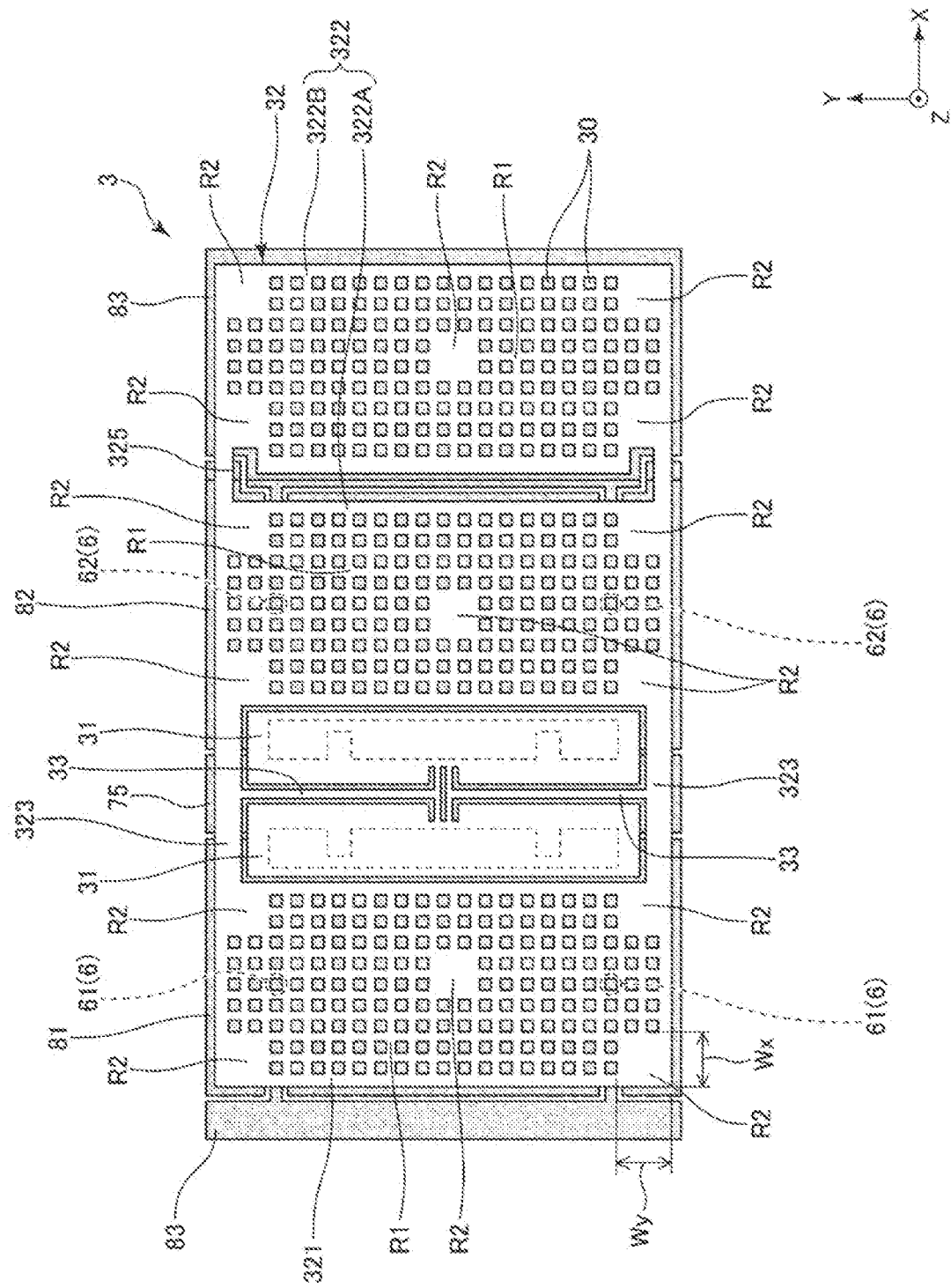
FIG. 33 is a plan view showing a modification example of the physical quantity sensor shown in FIG. 1.
Figure 34:
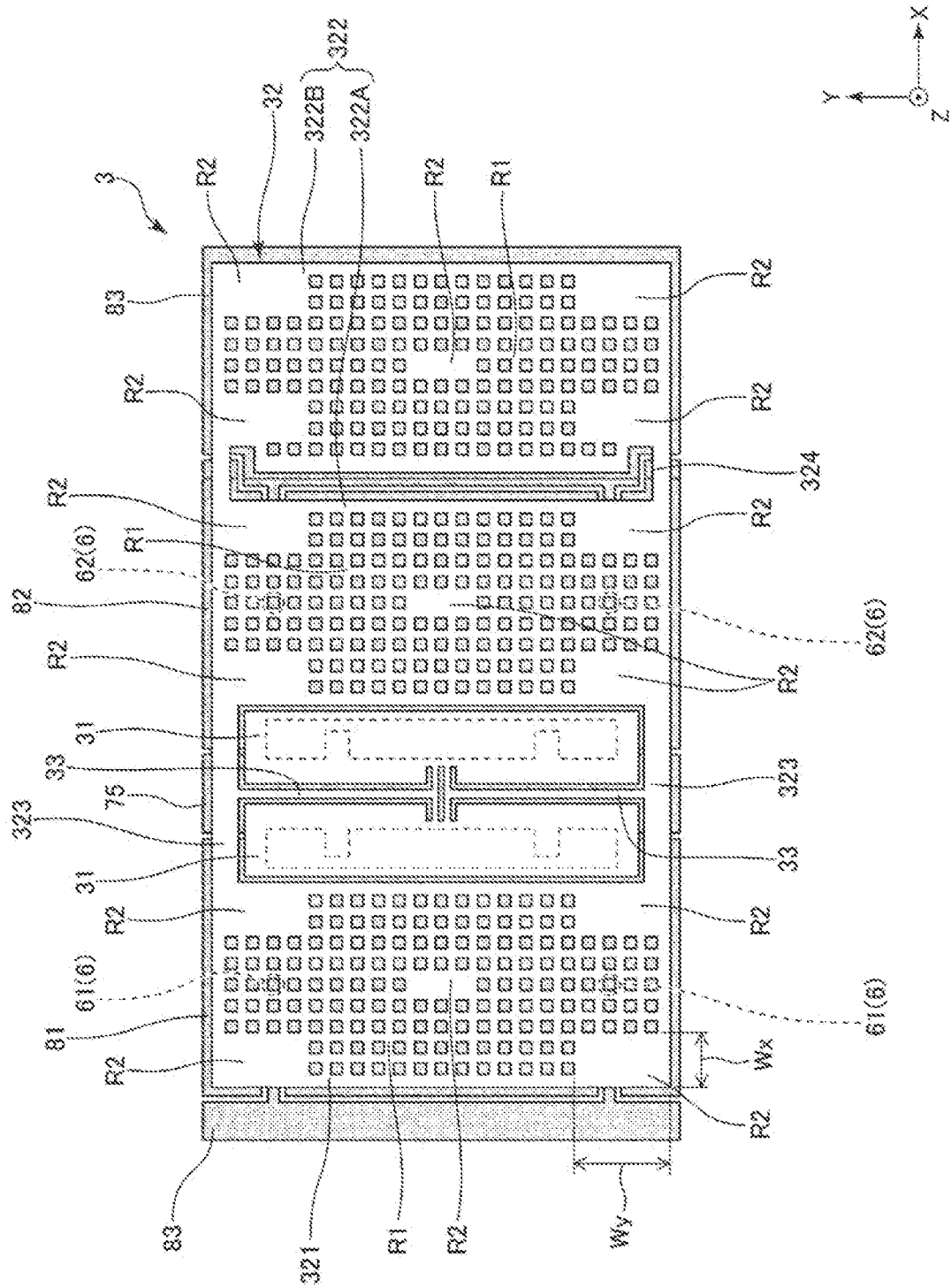
FIG. 34 is a plan view showing a modification example of the physical quantity sensor shown in FIG. 1.
Figure 35:
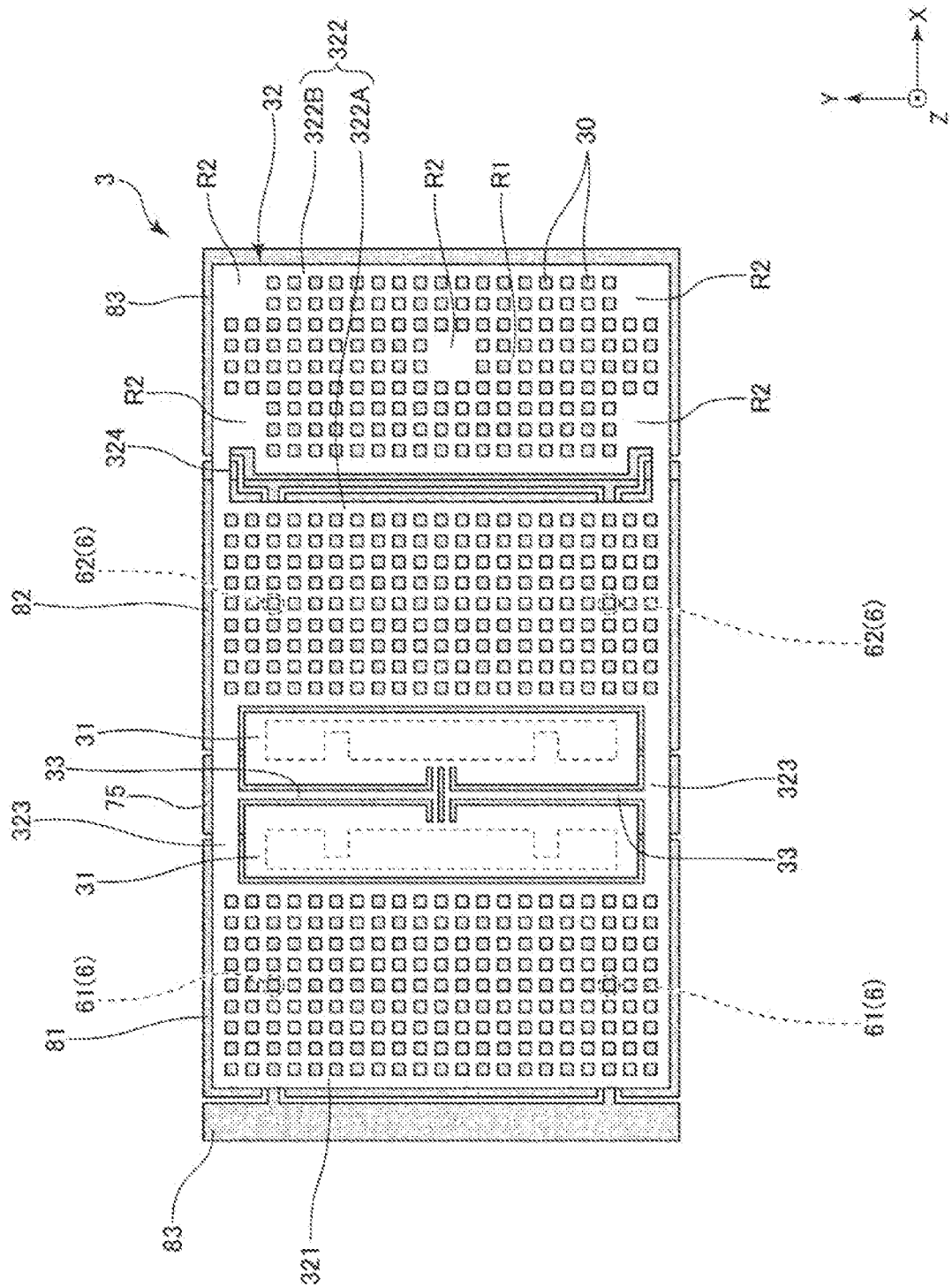
FIG. 35 is a plan view showing a modification example of the physical quantity sensor shown in FIG. 1.

Also, for example, in a configuration shown in FIG. 33, five second regions R2 are provided also in the torque generation part 322B of the second mass part 322 in addition to the configuration shown in FIG. 32. The five second regions R2 provided in the torque generation part 322B are dispersed at a center part and the four corners of the torque generation part 322B. Also, for example, in a configuration shown in FIG. 34, the position where the second region R2 is arranged is the same as in the configuration shown in FIG. 33. However, the second region R2 located at each center part is formed by omitting the formation of 1×3 penetration holes 30, that is, 3 penetration holes 30 in total. The second region R2 located at the four corners is formed by omitting the formation of 2×4 penetration holes 30, that is, 8 penetration holes 30 in total. Also, for example, in a configuration shown in FIG. 35, the second region R2 provided in the first mass part 321 and the second region R2 provided in the base part 322A are omitted from the configuration shown in FIG. 33.

Figure 36:
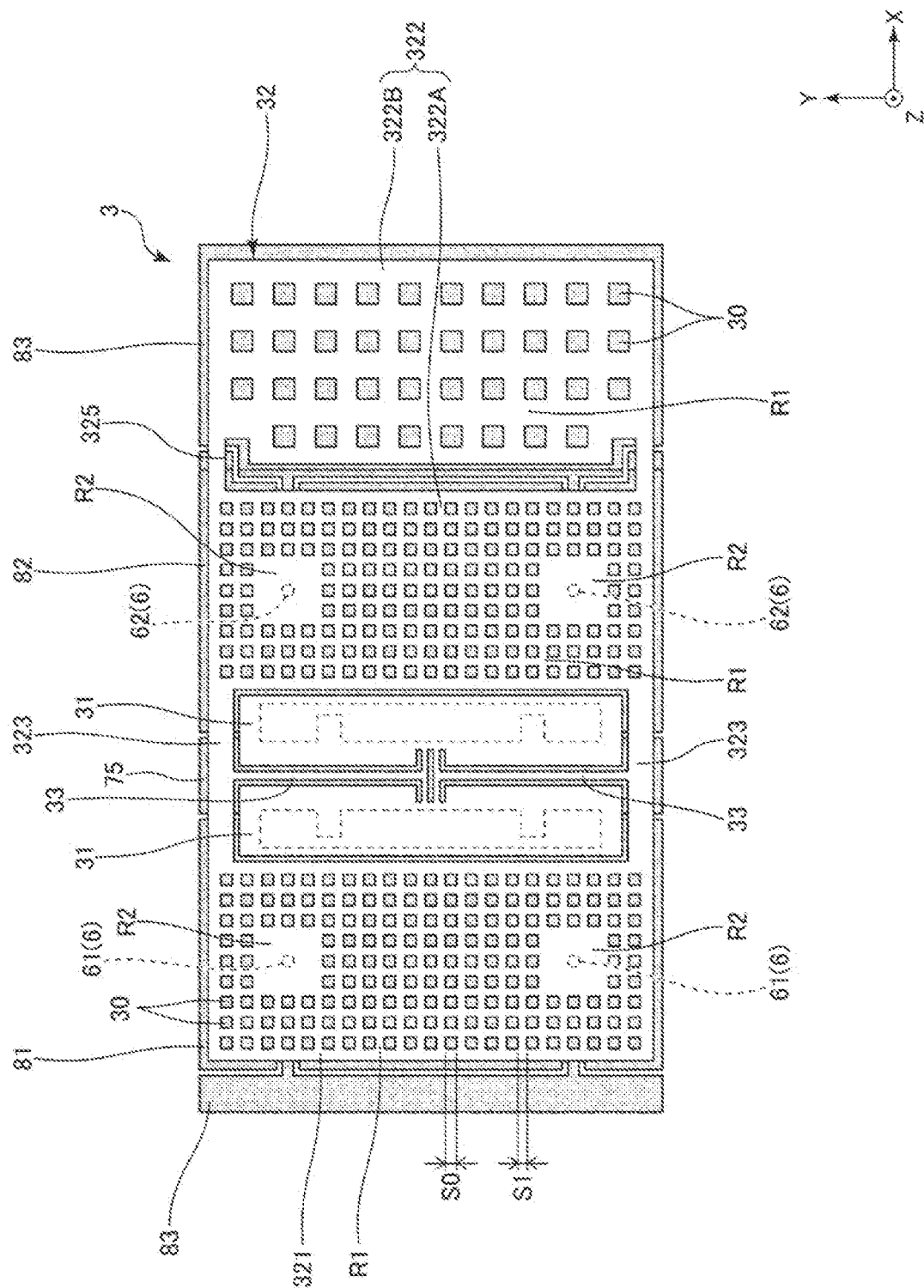
FIG. 36 is a plan view showing a modification example of the physical quantity sensor shown in FIG. 1.

Also, for example, in a configuration shown in FIG. 36, the range of S0, S1 where H and h are constant satisfies the formula (17) also at the torque generation part 322B. This configuration can sufficiently reduce the damping in the moving member 32, maintain the sensitivity of detection within a desired range, and reduce the noise. Preferably, the range of S0, S1 may satisfy the formula (18), more preferably the formula (19), and even more preferably the formula (20). In this configuration, the length h in the Z-axis direction of the gap Q is equal at the first mass part 321 and the base part 322A and shorter at the torque generation part 322B. Accordingly, the length S0 of one side of the penetration hole 30 is equal at the first mass part 321 and the base part 322A and shorter at the torque generation part 322B, and the space S1 between the penetration holes 30 next to each other is equal at the first mass part 321 and the base part 322A and smaller at the torque generation part 322B.

The physical quantity sensor 1 has been described. As described above, such a physical quantity sensor 1 has the substrate 2 and the moving member 32 facing the substrate 2 in the Z-axis direction via the gap and becoming displaced in the Z-axis direction in relation to the substrate 2, when three directions orthogonal to one another are defined as the Y-axis direction as the first direction, the X-axis direction as the second direction, and the Z-axis direction as the third direction. The moving member 32 has the first region R1 that has a plurality of penetration holes 30 penetrating the moving member 32 in the Z-axis direction and having a square opening shape as viewed from the Z-axis direction, and the second region R2 having no penetration hole 30. At least one of the width Wx, which is the length in the X-axis direction of the second region R2, and the width Wy, which is the length in the Y-axis direction of the second region R2, is equal to or greater than S0+2×S1, where S0 is the length of one side of the penetration hole 30, and S1 is the space between the penetration holes 30 next to each other.

Providing the second region R2 having such a size in the moving member 32 increases the mechanical strength of the moving member 32. Also, the squeeze film damping in the moving member 32 can be intentionally increased. Therefore, the Q value of the frequency characteristic of the physical quantity sensor 1 can be reduced, thus making the moving member 32 less likely to vibrate in a high-frequency region. The moving member 32 is thus made less likely to vibrate in the high-frequency region and is effectively restrained from being damaged even when a strong vibration in the high-frequency region is applied.

As described above, the area of the second region R2 is $36 \times S0^2 + 64 \times S1^2 + 96 \times S0 \times S1$ or greater. Thus, the squeeze film damping in the moving member 32 can be sufficiently increased and the amount of displacement of the moving member 32 in the high-frequency region can be restrained to a sufficiently small amount.

As described above, the area of the second region R2 is 17100 µm² or smaller. Thus, a detectable frequency range, that is, a lowest detectable frequency, can be sufficiently secured.

As described above, the first region R1 satisfies the formula (13). This makes the design of the plurality of penetration holes 30 appropriate and thus can achieve an excellent sensitivity of detection and sufficient reduction of the damping. Thus, the physical quantity sensor 1 that has an excellent sensitivity of detection and can secure a desired frequency range is provided.

As described above, the physical quantity sensor 1 has the fixed part 31 fixed to the substrate 2, and the support beam 33 coupling the moving member 32 and the fixed part 31 together and forming the rotation axis J along the Y-axis direction. The moving member 32 has the first mass part 321 that is displaceable about the rotation axis J and is located on one side of the X-axis direction in relation to the rotation axis J, as viewed in a plan view from the Z-axis direction, and the second mass part 322 located on the other side and having a greater moment of rotation about the rotation axis J than the first mass part 321. The second mass part 322 has the base part 322A, which is the first part symmetrical with the first mass part 321 about the rotation axis J, and the torque generation part 322B, which is the second part located at a more distant position from the rotation axis J than the base part 322A and asymmetrical with the first mass part 321 in relation to the rotation axis J. Each of the first regions R1 located in the first mass part 321 and the base part 322A satisfies C≤1.5×Cmin. Thus, in the seesawing moving member 32, the damping in the first region R1 can be sufficiently reduced.

As described above, the first region R1 located in the torque generation part 322B satisfies C≤2.5×Cmin. Thus, in the seesawing moving member 32, the damping in the first region R1 can be sufficiently reduced. Also, the mass of the torque generation part 322B is secured more easily and a drop in the sensitivity of detection is effectively restrained.

As described above, the physical quantity sensor 1 has the protrusion 6 protruding toward the moving member 32 from the substrate 2 and overlapping the second region R2 as viewed in a plan view from the Z-axis direction. Thus, the mechanical strength of the part coming into contact with the protrusion 6, of the moving member 32, increases and damage to the moving member 32 due to contact is restrained. Also, the contact with the protrusion 6 effectively restrains the moving member 32 from sticking to the substrate 2.

Second Embodiment

Figure 37:
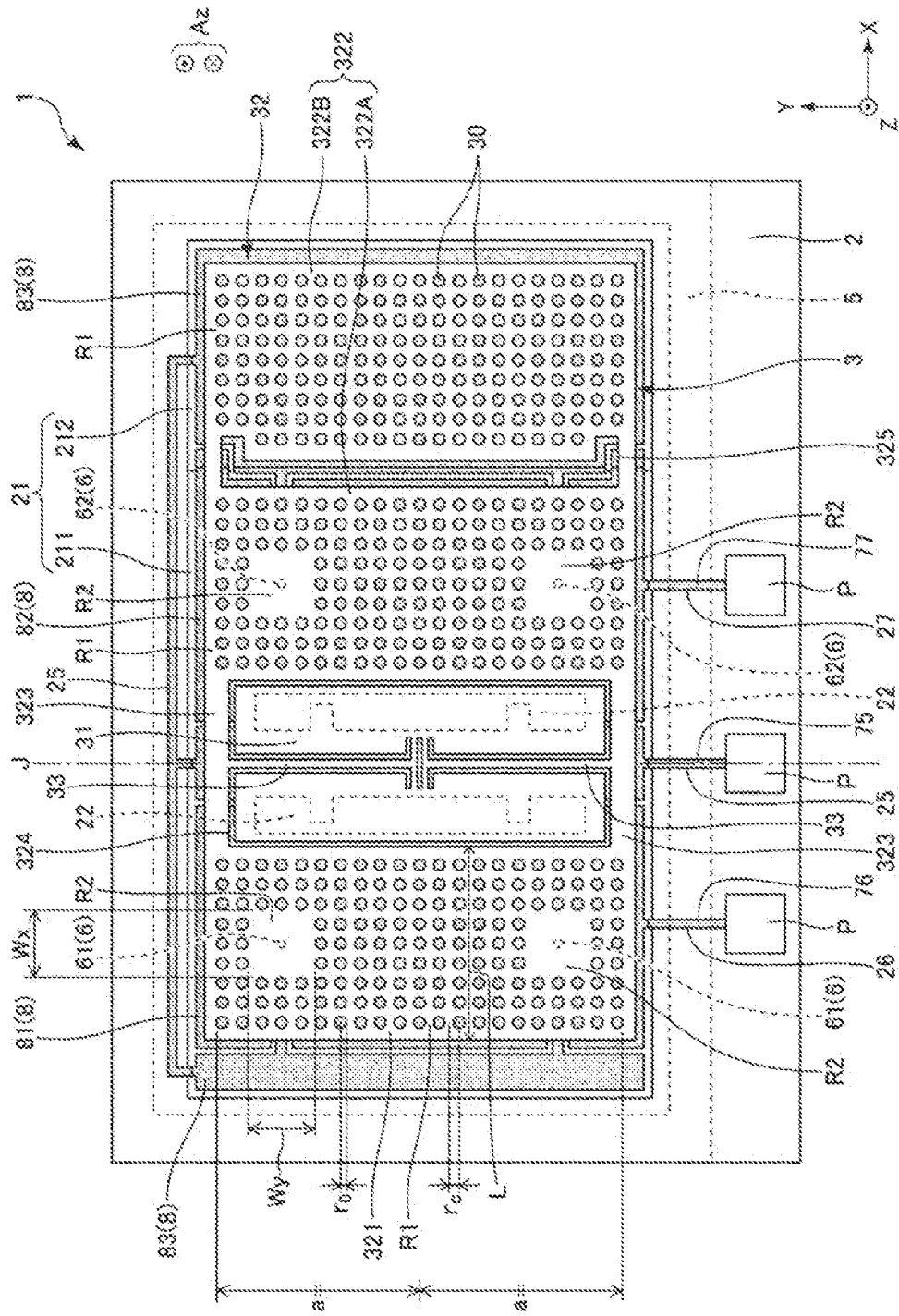
FIG. 37 is a plan view showing a physical quantity sensor according to a second embodiment.

FIG. 37 is a plan view showing a physical quantity sensor according to a second embodiment of the present disclosure.

This embodiment is similar to the first embodiment except that the opening shape of the penetration hole 30 is different. In the description below, this embodiment is described mainly in terms of the difference from the foregoing embodiment and the description of similar matters is omitted. In FIG. 37, components similar to those in the foregoing embodiment are denoted by the same reference numbers.

As shown in FIG. 37, each of a plurality of penetration holes 30 formed in the first region R1 has a circular opening shape as viewed in a plan view. The plurality of penetration holes 30 are evenly arranged over the entire area of the first region R1. The plurality of penetration holes 30 are arranged regularly as viewed in a plan view, and particularly in this embodiment, arranged in a matrix laid along the X-axis direction and the Y-axis direction. The plurality of penetration holes 30 are the same size as each other.

The term "circular" means being substantially circular and includes not only a perfect circle but also a shape slightly deviated from a circle, for example, a shape having a roundness of 0.9 to 1.0 in consideration of an error or the like that can occur in manufacturing.

In this embodiment, $r_0$ in the formula (9) is the radius of the penetration hole 30 and $r_c$ in the formula (8) is half the distance between the centers of the penetration holes 30 next to each other.

In the physical quantity sensor 1 of such a configuration, at least one of the width Wx and the width Wy of each second region R2 is $4\times r_c - 2\times r_0$ or more. Thus, as in the first embodiment, the mechanical strength of the moving member 32 can be increased. Also, the squeeze film damping in the moving member 32 can be intentionally increased. Therefore, the Q value of the frequency characteristic of the physical quantity sensor 1 can be reduced, thus making the moving member 32 less likely to vibrate in a high-frequency region. The moving member 32 is thus made less likely to vibrate in the high-frequency region and is effectively restrained from being damaged even when a strong vibration in the high-frequency region is applied.

Particularly in this embodiment, both the width Wx and the width Wy are $4\times r_c - 2\times r_0$ or more. That is, $Wx \geq 4\times r_c - 2\times r_0$ and $Wy \geq 4\times r_c - 2\times r_0$. This makes the above effect more prominent. In this embodiment, each second region R2 is square-shaped as viewed in a plan view from the Z-axis direction and is formed by omitting the formation of 3×3 penetration holes 30, that is, 9 penetration hole 30 in total. Therefore, each of the width Wx and the width Wy of each second region R2 is $8\times r_c - 2\times r_0$. Since the second region R2 has the widths Wx and Wy that are sufficiently larger than the lower limit value of $4\times r_c - 2\times r_0$, the above effect becomes more prominent.

As described above, the physical quantity sensor 1 according to this embodiment has the substrate 2 and the moving member 32 facing the substrate 2 in the Z-axis direction via the gap and becoming displaced in the Z-axis direction in relation to the substrate 2, when three directions orthogonal to one another are defined as the Y-axis direction as the first direction, the X-axis direction as the second direction, and the Z-axis direction as the third direction. The moving member 32 has the first region R1 that has a plurality of penetration holes 30 penetrating the moving member 32 in the Z-axis direction and having a circular opening shape as viewed from the Z-axis direction, and the second region R2 having no penetration hole 30. At least one of the width Wx, which is the length in the X-axis direction of the second region R2, and the width Wy, which is the length in the Y-axis direction of the second region R2, is equal to or greater than $4\times r_c - 2\times r_0$, where $r_0$ is the radius of the penetration hole 30 and $r_c$ is half the distance between the centers of the penetration holes 30 next to each other.

Providing such a second region R2 in the moving member 32 increases the mechanical strength of the moving member 32. Also, the squeeze film damping in the moving member 32 can be intentionally increased. Therefore, the Q value of the frequency characteristic of the physical quantity sensor 1 can be reduced, thus making the moving member 32 less likely to vibrate in a high-frequency region. The moving member 32 is thus made less likely to vibrate in the high-frequency region and is effectively restrained from being damaged even when a strong vibration in the high-frequency region is applied.

The second embodiment as described above can achieve effects similar to those in the first embodiment.

Third Embodiment

Figure 38:
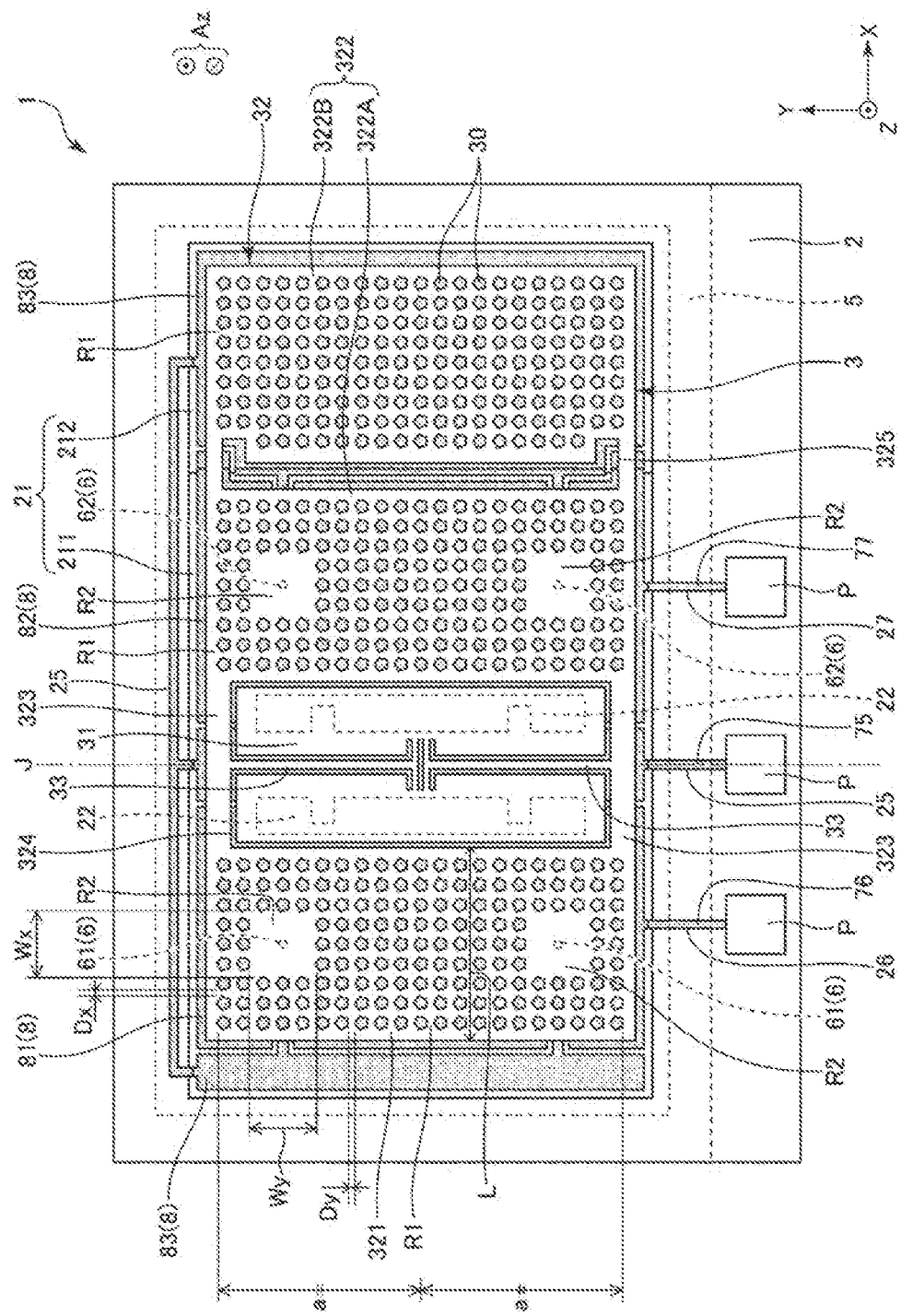
FIG. 38 is a cross-sectional view showing a physical quantity sensor according to a third embodiment.

FIG. 38 is a plan view showing a physical quantity sensor according to a third embodiment of the present disclosure.

This embodiment is similar to the first embodiment except that the opening shape of the penetration hole 30 is different. In the description below, this embodiment is described mainly in terms of the difference from the foregoing embodiment and the description of similar matters is omitted. In FIG. 38, components similar to those in the foregoing embodiment are denoted by the same reference numbers.

As shown in FIG. 38, each of a plurality of penetration holes 30 formed in the first region R1 has an opening shape of a regular pentagon as viewed in a plan view. The plurality of penetration holes 30 are evenly arranged over the entire area of the first region R1. The plurality of penetration holes 30 are arranged regularly as viewed in a plan view, and particularly in this embodiment, arranged in a matrix laid along the X-axis direction and the Y-axis direction. The plurality of penetration holes 30 are the same size as each other.

In the first embodiment, S0 is the length of one side of the square of the penetration hole 30 and S1 is the space between the penetration holes 30 next to each other in the X-axis direction or the Y-axis direction. However, in this embodiment, S0 is the square root of the area of the penetration hole 30 and S1 is the value of a space Dx between the penetration holes 30 next to each other in the X-axis direction and a space Dy between the penetration holes 30 next to each other in the Y-axis direction added together and divided by 2.

In the physical quantity sensor 1 of such a configuration, at least one of the width Wx and the width Wy of each second region R2 is S0+2×S1 or more. Thus, as in the first embodiment, the mechanical strength of the moving member 32 can be increased. Also, the squeeze film damping in the moving member 32 can be intentionally increased. Therefore, the Q value of the frequency characteristic of the physical quantity sensor 1 can be reduced, thus making the moving member 32 less likely to vibrate in a high-frequency region. The moving member 32 is thus made less likely to vibrate in the high-frequency region and is effectively restrained from being damaged even when a strong vibration in the high-frequency region is applied.

Particularly in this embodiment, both the width Wx and the width Wy are S0+2×S1 or more. That is, Wx≥S0+2×S1 and Wy≥S0+2×S1. This makes the above effect more prominent. In this embodiment, each second region R2 is square-shaped as viewed in a plan view from the Z-axis direction and is formed by omitting the formation of 3×3 penetration holes 30, that is, 9 penetration hole 30 in total. Therefore, each of the width Wx and the width Wy of each second region R2 is approximately 3×S0+4×S1. Since the second region R2 has the widths Wx and Wy that are sufficiently larger than the lower limit value of S0+2×S1, the above effect becomes more prominent.

As described above, the physical quantity sensor 1 according to this embodiment has the substrate 2 and the moving member 32 facing the substrate 2 in the Z-axis direction via the gap and becoming displaced in the Z-axis direction in relation to the substrate 2, when three directions orthogonal to one another are defined as the Y-axis direction as the first direction, the X-axis direction as the second direction, and the Z-axis direction as the third direction. The moving member 32 has the first region R1 that has a plurality of penetration holes 30 penetrating the moving member 32 in the Z-axis direction and having a polygonal opening shape as viewed from the Z-axis direction, and the second region R2 having no penetration hole 30. At least one of the width Wx, which is the length in the X-axis direction of the second region R2, and the width Wy, which is the length in the Y-axis direction of the second region R2, is equal to or greater than S0+2×S1, where S0 is the square root of the area of the penetration hole 30 and S1 is the value of the space Dx between the penetration holes 30 next to each other in the X-axis direction and the space Dy between the penetration holes 30 next to each other in the Y-axis direction added together and divided by 2.

Providing the second region R2 of such a size in the moving member 32 increases the mechanical strength of the moving member 32. Also, the squeeze film damping in the moving member 32 can be intentionally increased. Therefore, the Q value of the frequency characteristic of the physical quantity sensor 1 can be reduced, thus making the moving member 32 less likely to vibrate in a high-frequency region. The moving member 32 is thus made less likely to vibrate in the high-frequency region and is effectively restrained from being damaged even when a strong vibration in the high-frequency region is applied.

The third embodiment as described above can achieve effects similar to those in the first embodiment.

In this embodiment, the opening shape of the penetration hole 30 as viewed in a plan view is a regular pentagon. However, this is not limiting. The opening shape may be, for example, a triangle, a square, a pentagon that is not a regular pentagon, a hexagon, or other polygons having more sides than a hexagon. Effects similar to those in this embodiment can be achieved even when the opening shape of the penetration hole 30 is a polygon other than a regular pentagon.

Fourth Embodiment

Figure 39:
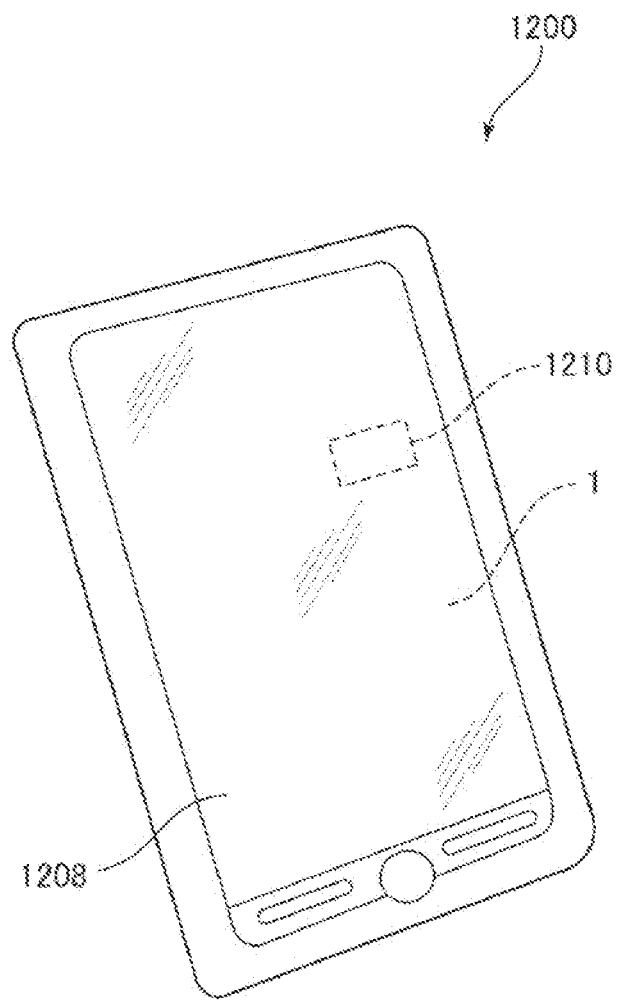
FIG. 39 is a plan view showing a smartphone as an electronic apparatus according to a fourth embodiment.

FIG. 39 is a plan view showing a smartphone as an electronic apparatus according to a fourth embodiment.

A smartphone 1200 shown in FIG. 39 is a smartphone to which the electronic apparatus according to the present disclosure is applied. The physical quantity sensor 1 and a control circuit 1210 performing control based on a detection signal outputted from the physical quantity sensor 1 are built in the smartphone 1200. Detection data detected by the physical quantity sensor 1 is transmitted to the control circuit 1210. The control circuit 1210 recognizes the attitude and behavior of the smartphone 1200, based on the received detection data, and can change an image displayed at a display unit 1208, output a warning sound or a sound effect, and drive a vibration motor to vibrate the main body.

Such a smartphone 1200 as an electronic apparatus has the physical quantity sensor 1 and the control circuit 1210 performing control based on a detection signal outputted from the physical quantity sensor 1. Therefore, the smartphone 1200 has the effects of the physical quantity sensor 1 and achieves high reliability.

The electronic apparatus according to the present disclosure can be applied not only to the smartphone 1200 but also to other devices such as a personal computer, digital still camera, tablet terminal, timepiece, smartwatch, inkjet printer, laptop personal computer, television, wearable terminal such as smart glasses or HMD (head-mounted display), video camera, video tape recorder, car navigation device, drive recorder, pager, electronic organizer, electronic dictionary, electronic translator, electronic calculator, electronic game device, toy, word processor, workstation, videophone, security monitor, electronic binoculars, POS terminal, medical equipment, fishfinder, various measuring devices, mobile terminal base station apparatus, various instruments for vehicle, railway train, aircraft, helicopter, ship and the like, flight simulator, and network server.

Fifth Embodiment

Figure 40:
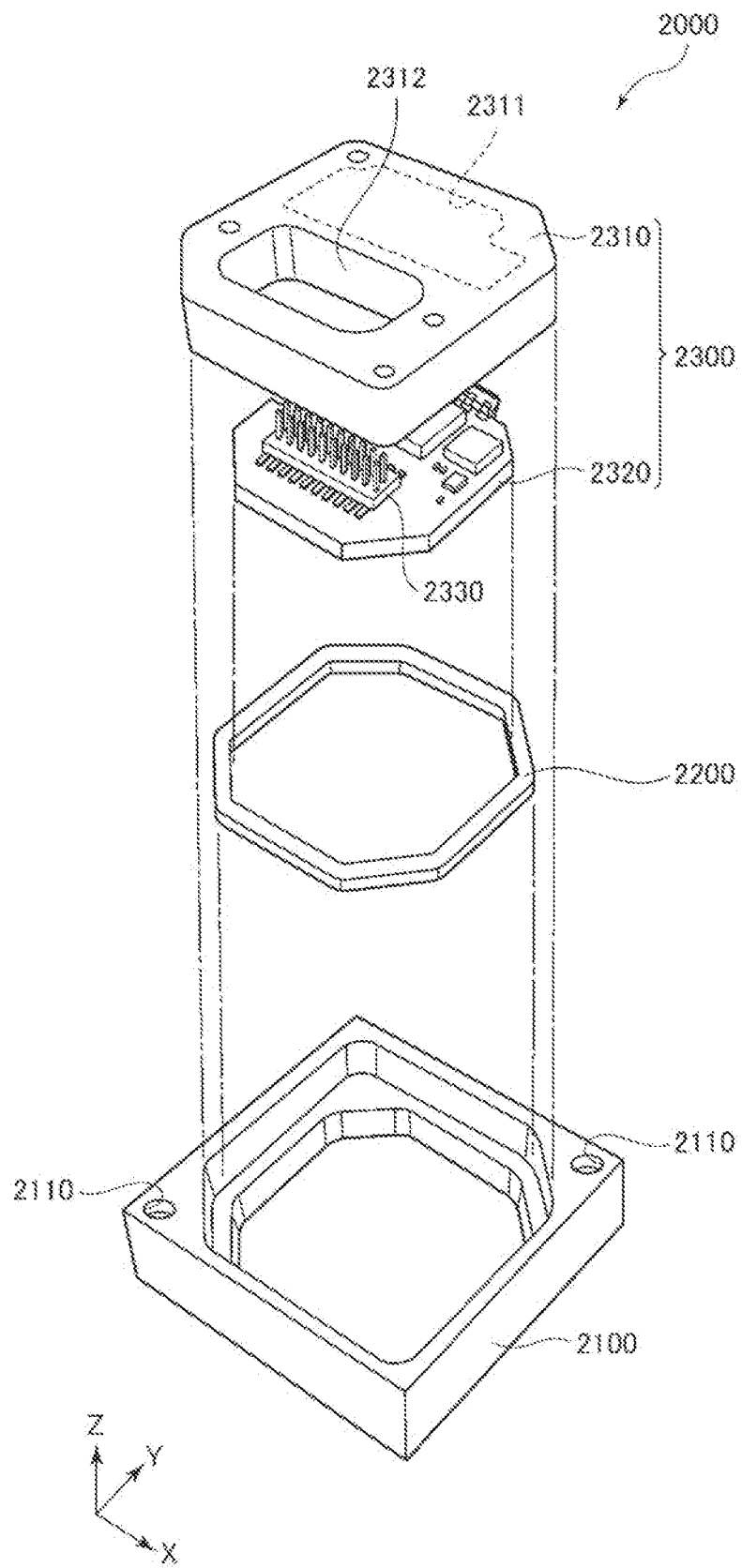
FIG. 40 is an exploded perspective view showing an inertial measurement unit as an electronic apparatus according to a fifth embodiment.
Figure 41:
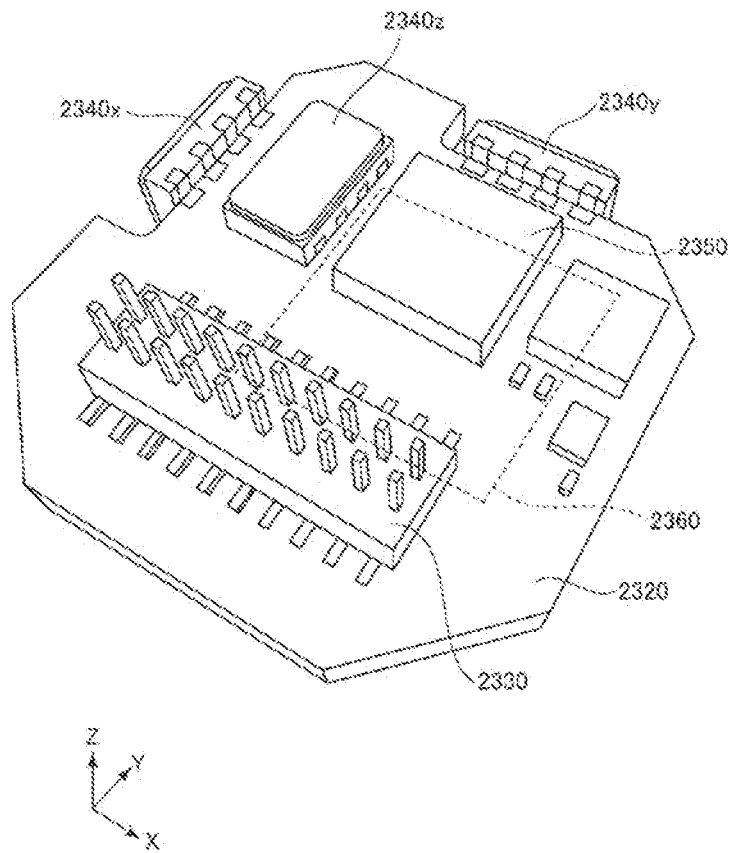
FIG. 41 is a perspective view of a substrate provided in the inertial measurement unit shown in FIG. 40.

FIG. 40 is an exploded perspective view showing an inertial measurement unit according to a fifth embodiment. FIG. 41 is a perspective view of a substrate provided in the inertial measurement unit shown in FIG. 40.

An inertial measurement unit 2000 (IMU) as an electronic device shown in FIG. 40 is an inertial measurement unit detecting an attitude and behavior of an installation target device such as an automobile or robot. The inertial measurement unit 2000 functions as a 6-axis motion sensor having a 3-axis acceleration sensor and a 3-axis angular velocity sensor.

The inertial measurement unit 2000 is a rectangular parallelepiped having a substantially square planar shape. A screw hole 2110 as a fixing part is formed near two vertices located along a diagonal line of the square. Two screws can be inserted into the two screw holes 2110 to fix the inertial measurement unit 2000 to an installation target surface of an installation target object such as an automobile. Properly selecting components or changing the design enables miniaturization of the inertial measurement unit 2000 into a size that can be installed, for example, in a smartphone or digital camera.

The inertial measurement unit 2000 has an outer case 2100, a bonding member 2200, and a sensor module 2300. The sensor module 2300 is inserted in the outer case 2100 via the bonding member 2200. The outer shape of the outer case 2100 is a rectangular parallelepiped having a substantially square planar shape, similarly to the overall shape of the inertial measurement unit 2000. The screw hole 2110 is formed near two vertices along a diagonal line of the square. The outer case 2100 is in the shape of a box, with the sensor module 2300 accommodated inside.

The sensor module 2300 has an inner case 2310 and a substrate 2320. The inner case 2310 is a member supporting the substrate 2320 and has a shape to fit inside the outer case 2100. In the inner case 2310, a recess 2311 for preventing contact with the substrate 2320 and an opening 2312 for exposing a connector 2330, described later, are formed. Such an inner case 2310 is bonded to the outer case 2100 via the bonding member 2200. The substrate 2320 is bonded to a lower surface of the inner case 2310 via an adhesive.

As shown in FIG. 41, the connector 2330, an angular velocity sensor 2340z detecting an angular velocity about the Z-axis, and an acceleration sensor 2350 detecting an acceleration in each of the X-axis, Y-axis, and Z-axis directions, and the like, are installed at an upper surface of the substrate 2320. On lateral surfaces of the substrate 2320, an angular velocity sensor 2340x detecting an angular velocity about the X-axis and an angular velocity sensor 2340y detecting an angular velocity about the Y-axis are installed. For example, the physical quantity sensor according to the present disclosure can be used as the acceleration sensor 2350.

A control IC 2360 is installed at a lower surface of the substrate 2320. The control IC 2360 is an MCU (micro controller unit) and controls each part of the inertial measurement unit 2000. In a storage unit, a program prescribing an order and content for detecting an acceleration and an angular velocity, a program for digitizing and incorporating detection data into packet data, and accompanying data and the like are stored. In addition, a plurality of other electronic components are installed at the substrate 2320.

Sixth Embodiment

Figure 42:
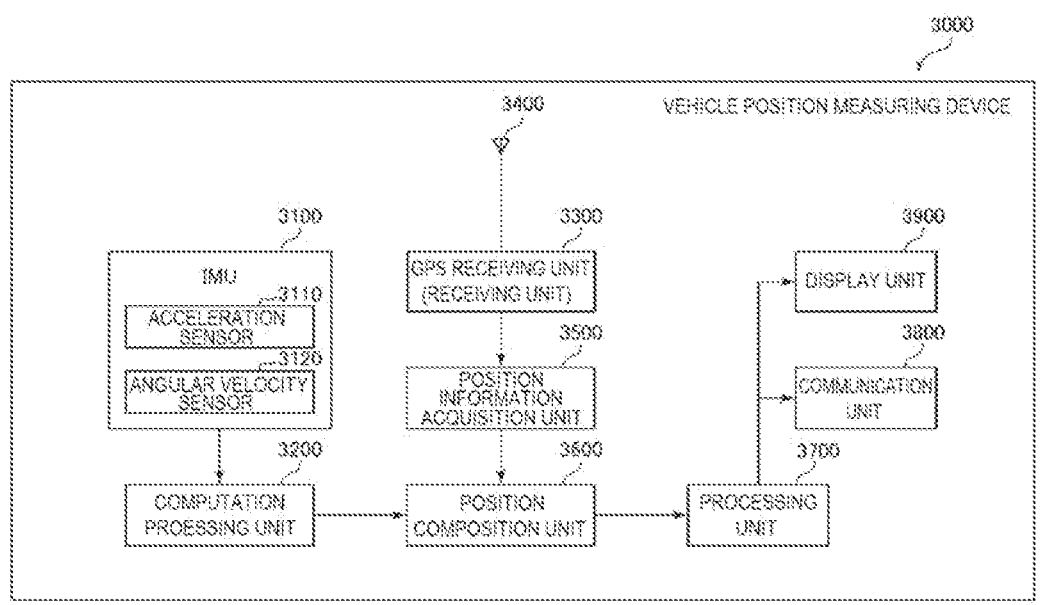
FIG. 42 is a block diagram showing an overall system of a vehicle position measuring device as an electronic apparatus according to a sixth embodiment.
Figure 43:
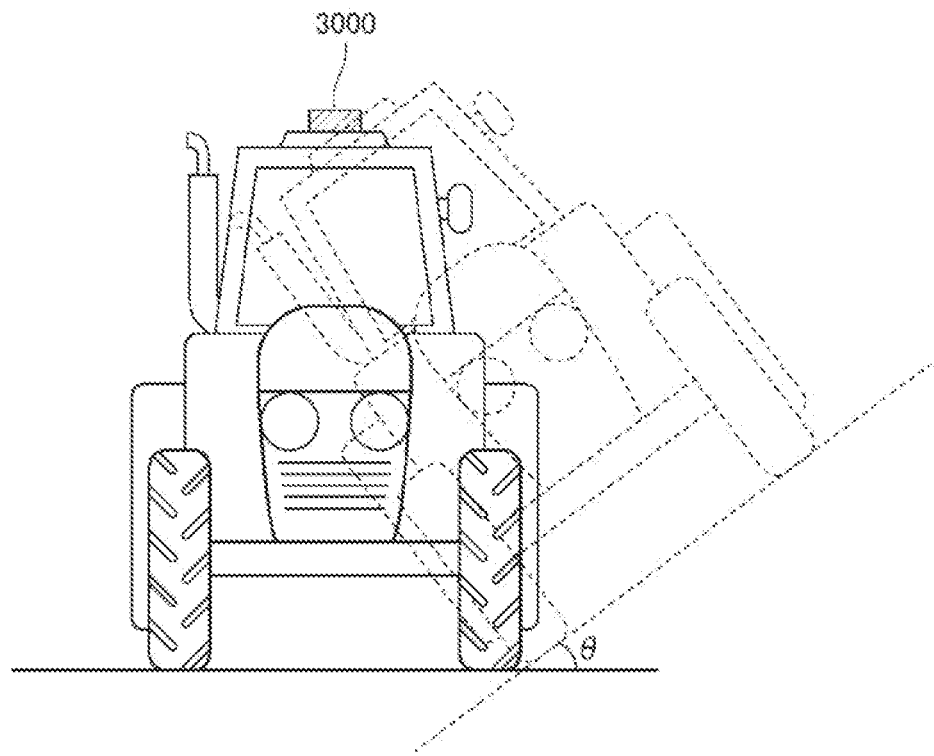
FIG. 43 shows an operation of the vehicle position measuring device shown in FIG. 42.

FIG. 42 is a block diagram showing an overall system of a vehicle position measuring device as an electronic apparatus according to a sixth embodiment. FIG. 43 shows an operation of the vehicle position measuring device shown in FIG. 42.

A vehicle position measuring device 3000 shown in FIG. 42 is a device installed and used on a vehicle in order to measure the position of the vehicle. The vehicle is not particularly limited and may be any of bicycle, automobile motorcycle, train, airplane, ship, and the like. In this embodiment, the case where a four-wheeled automobile, particularly an agricultural tractor, is used as the vehicle is described.

The vehicle position measuring device 3000 has an inertial measurement unit 3100 (IMU), a computation processing unit 3200, a GPS receiving unit 3300, a receiving antenna 3400, a position information acquisition unit 3500, a position composition unit 3600, a processing unit 3700, a communication unit 3800, and a display unit 3900. As the inertial measurement unit 3100, for example, the foregoing inertial measurement unit 2000 can be used.

The inertial measurement unit 3100 has an acceleration sensor 3110 for three axes and an angular velocity sensor 3120 for three axes. The computation processing unit 3200 receives acceleration data from the acceleration sensor 3110 and angular velocity data from the angular velocity sensor 3120, carries out inertial navigation processing on these data, and outputs inertial navigation positioning data including the acceleration and attitude of the vehicle.

The GPS receiving unit 3300 receives a signal from a GPS satellite via the receiving antenna 3400. The position information acquisition unit 3500 outputs GPS positioning data representing the position (latitude, longitude, altitude), velocity, and direction of the vehicle position measuring device 3000, based on the signal received by the GPS receiving unit 3300. The GPS positioning data also includes status data representing the receiving state, the time of reception, and the like.

The position composition unit 3600 calculates the position of the vehicle, specifically, which position on the ground the vehicle is travelling at, based on the inertial navigation positioning data outputted from the computation processing unit 3200 and the GPS positioning data outputted from the position information acquisition unit 3500. For example, even when the position of the vehicle included in the GPS positioning data is the same, if the attitude of vehicle is different due to the influence of a slope θ or the like on the ground, as shown in FIG. 43, the vehicle is regarded as travelling at a different position on the ground. Therefore, the accurate position of the vehicle cannot be calculated, simply based on the GPS positioning data. Thus, the position composition unit 3600 calculates which position on the ground the vehicle is travelling at, using the inertial navigation positioning data.

The position data outputted from the position composition unit 3600 is processed in a predetermined manner by the processing unit 3700 and the processed position data is displayed as the result of position measurement at the display unit 3900. The position data may also be transmitted to an external device by the communication unit 3800.

Seventh Embodiment

Figure 44:
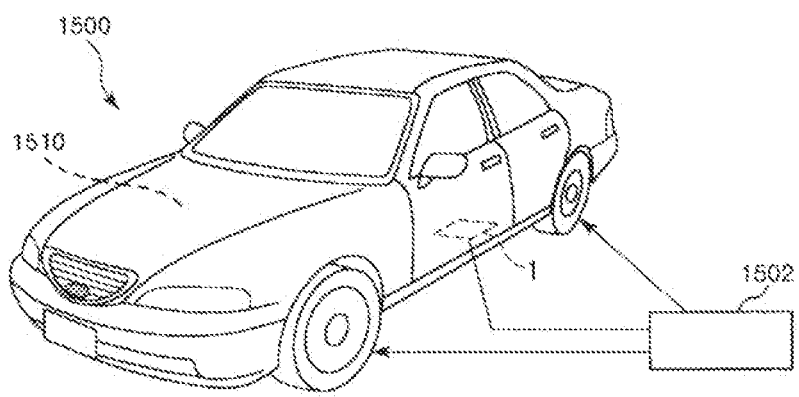
FIG. 44 is a perspective view showing a vehicle according to a seventh embodiment.

FIG. 44 is a perspective view showing a vehicle according to a seventh embodiment.

An automobile 1500 shown in FIG. 44 is an automobile to which the vehicle according to the present disclosure is applied. In this illustration, the automobile 1500 includes a system 1510 which is at least one of an engine system, a brake system, and a keyless entry system. The physical quantity sensor 1 is built in the automobile 1500 and can detect the attitude of the vehicle body. A detection signal from the physical quantity sensor 1 is supplied to a control circuit 1502. Based on the signal, the control circuit 1502 can control the system 1510.

In this way, the automobile 1500 as a vehicle has the physical quantity sensor 1 and the control circuit 1502 performing control based on a detection signal outputted from the physical quantity sensor 1. Therefore, the automobile 1500 has the effects of the physical quantity sensor 1 and achieves high reliability.

The physical quantity sensor 1 can also be broadly applied to a car navigation system, car air-conditioning, anti-lock braking system (ABS), airbags, tire pressure monitoring system (TPMS), engine control, and electronic control unit (ECU) such as battery monitor for hybrid car or electric vehicle. The vehicle is not limited to the automobile 1500. For example, a railway train, airplane, helicopter, rocket, artificial satellite, ship, AGV (automated guided vehicle), elevator, escalator, bipedal robot, unmanned aircraft such as drone, radio-controlled model, model train, toy or the like can be employed.

The physical quantity sensor, the electronic apparatus, and the vehicle according to the present disclosure have been described above, based on the illustrated embodiments. However, the present disclosure is not limited to these embodiments. The configuration of each part can be replaced by any configuration having a similar function. Also, any other component may be added to the present disclosure. Moreover, the foregoing embodiments may be suitably combined together.

In the embodiments, the configuration where the physical quantity sensor detects an acceleration is described. However, the physical quantity detected by the physical quantity sensor is not particularly limited and may be, for example, an angular velocity, pressure or the like.

What is claimed is:

1. A physical quantity sensor comprising, when three directions orthogonal to one another are defined as a first direction, a second direction, and a third direction:
a substrate; and
a moving member facing the substrate in the third direction via a gap and becoming displaced in the third direction in relation to the substrate, wherein
the moving member has a first region that has a plurality of penetration holes penetrating the moving member in the third direction and having a square opening shape as viewed from the third direction, and a second region having no penetration hole, the second region being surrounded by the plurality of penetration holes, and
at least one of a length in the first direction and a length in the second direction of the second region is equal to or greater than S0+2×S1, where
S0 is a length of one side of the penetration hole, and
S1 is a space between the penetration holes next to each other.

2. The physical quantity sensor according to claim 1, wherein
the second region has an area equal to or greater than 36×S0²+64×S1²+96×S0×S1.

3. The physical quantity sensor according to claim 1, wherein
the second region has an area equal to or smaller than 17100 μm².

4. The physical quantity sensor according to claim 1, wherein
the first region satisfies $C \leq 1.5 \times C\mathrm{min}$ and $$C = 2aL\frac{8\mu H}{\beta^2 r_o^2}\left(1 + \frac{3r_o^4 K(\beta)}{16Hh^3}\right)\left[1 - \frac{l}{a}\tanh\left(\frac{a}{l}\right)\right] \quad (1)$$

$$l = \sqrt{\frac{2h^3 H_{\mathit{eff}}\eta(\beta)}{3\beta^2 r_o^2}}$$

$$H_{\mathit{eff}} = H + \frac{3\pi r_o}{8}$$

$$\eta(\beta) = 1 + \frac{3r_o^4 K(\beta)}{16Hh^3}$$

$$K(\beta) = 4\beta^2 - \beta^4 - 4\ln\beta - 3$$

$$\beta = \frac{r_o}{r_c}$$

$$r_c = \frac{S0 + S1}{\sqrt{\pi}}$$

$$r_0 = 0.547 \times S0$$

where
H [m] is a length of the penetration hole in the third direction,
a [m] is half a length of the moving member along the first direction,
L [m] is a length of the moving member along the second direction,
h [m] is a length of the gap in the third direction,
μ [kg/ms] is a viscous resistance of a gas in the gap,
C is a damping generated in the moving member, and
C in the formula (1) is defined as Cmin when satisfying $$\frac{3r_o^4 K(\beta)}{16Hh^3} = 1.$$

5. The physical quantity sensor according to claim 4, further comprising:
a fixed part fixed to the substrate; and
a support beam coupling the moving member and the fixed part together and forming a rotation axis along the first direction, wherein
the moving member has a first mass part that is displaceable about the rotation axis and is located on one side of the second direction in relation to the rotation axis, as viewed in a plan view from the third direction, and a second mass part located on the other side and having a greater moment of rotation about the rotation axis than the first mass part, the second mass part has a first part symmetrical with the first mass part about the rotation axis, and a second part located at a more distant position from the rotation axis than the first part and asymmetrical with the first mass part in relation to the rotation axis, and each of the first regions located in the first mass part and the first part satisfies C≤1.5×Cmin.

6. The physical quantity sensor according to claim 5, wherein the first region located in the second part satisfies C≤2.5×Cmin.

7. The physical quantity sensor according to claim 1, further comprising:

a protrusion protruding from the substrate toward the moving member and overlapping the second region as viewed in a plan view from the third direction.

8. An electronic apparatus comprising:

the physical quantity sensor according to claim 1; and a control circuit performing control based on a detection signal outputted from the physical quantity sensor.

9. A vehicle comprising:

the physical quantity sensor according to claim 1; and a control circuit performing control based on a detection signal outputted from the physical quantity sensor.

10. A physical quantity sensor comprising, when three directions orthogonal to one another are defined as a first direction, a second direction, and a third direction, a substrate; and a moving member facing the substrate in the third direction via a gap and becoming displaced in the third direction in relation to the substrate, wherein the moving member has a first region that has a plurality of penetration holes penetrating the moving member in the third direction and having a circular opening shape as viewed from the third direction, and a second region having no penetration hole, the second region being surrounded by the plurality of penetration holes, and at least one of a length in the first direction and a length in the second direction of the second region is equal to or greater than $4 \times r_c - 2 \times r_0$, where $r_0$ is a radius of the penetration hole, and $r_c$ is half a distance between centers of the penetration holes next to each other.

11. A physical quantity sensor comprising, when three directions orthogonal to one another are defined as a first direction, a second direction, and a third direction, a substrate; and a moving member facing the substrate in the third direction via a gap and becoming displaced in the third direction in relation to the substrate, wherein the moving member has a first region that has a plurality of penetration holes penetrating the moving member in the third direction and having a polygonal opening shape as viewed from the third direction, and a second region having no penetration hole, the second eon being surrounded by the plurality of penetration holes, and at least one of a length in the first direction and a length in the second direction of the second region is equal to or greater than $S0 + 2 \times S1$, where S0 is a square root of area of the penetration hole, and S1 is a value of spaces between the penetration holes next to each other in the first direction and the second direction added together and divided by 2.

* * * * *